United States Patent
Minamitani et al.

(10) Patent No.: US 6,439,447 B1
(45) Date of Patent: Aug. 27, 2002

(54) BUMP JOINING JUDGING DEVICE AND METHOD, AND SEMICONDUCTOR COMPONENT PRODUCTION DEVICE AND METHOD

(75) Inventors: Shozo Minamitani, Ibaraki; Kazushi Higashi, Neyagawa; Kenji Takahashi, Suita; Shinji Kanayama, Kashihara; Hiroshi Wada, Osaka; Takafumi Tsujisawa, Toyonaka; Makoto Akita, Takatsuki; Kenji Okamoto, Hirakata; Shinzo Eguchi, Kyotanabe; Yasuhiro Kametani, Tosashimizu, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/763,959

(22) PCT Filed: Aug. 27, 1999

(86) PCT No.: PCT/JP99/04620

§ 371 (c)(1),
(2), (4) Date: Feb. 28, 2001

(87) PCT Pub. No.: WO00/13229

PCT Pub. Date: Mar. 9, 2000

(30) Foreign Application Priority Data

Sep. 1, 1998 (JP) ............................................ 10/247325
Sep. 2, 1998 (JP) ............................................ 10/248429

(51) Int. Cl.[7] ............................. B23K 1/06; B23K 5/20; B23K 20/10; G01N 29/04
(52) U.S. Cl. ............................. 228/104; 228/1.1; 228/9; 228/110.1; 73/1.82; 73/582; 73/584
(58) Field of Search ................................. 228/102, 103, 228/104, 110.1, 180.22, 8, 9, 1.1; 73/1.82, 582, 584

(56) References Cited

U.S. PATENT DOCUMENTS

| | | | | |
|---|---|---|---|---|
| 3,784,079 A | * | 1/1974 | Spanjer | |
| 4,341,574 A | * | 7/1982 | Landes | |
| 4,438,880 A | * | 3/1984 | Smith et al. | |
| 4,586,642 A | * | 5/1986 | Dreibelbis et al. | |
| 4,786,860 A | * | 11/1988 | Zimmerman | |

(List continued on next page.)

FOREIGN PATENT DOCUMENTS

| | | | | |
|---|---|---|---|---|
| JP | 362140823 A | * | 6/1987 | |
| JP | 7-58448 | | 3/1995 | |
| JP | 7-142545 | | 6/1995 | |
| JP | 10-75096 | | 3/1998 | |
| JP | 2001094245 A | * | 4/2001 | |

Primary Examiner—Tom Dunn
Assistant Examiner—Kiley Stoner

(57) ABSTRACT

When electrodes on an electronic component and electrode portions on a circuit board are joined via bumps with the electronic component and the circuit board vibrated respectively, a vibration damping detect device and a deciding device detect damping of the vibration caused by a progress of joining between the bumps and the electrode portions, and then determine a good or defective of the joining on a basis of the damping of the vibration. Further, regarding an impedance of an ultrasonic oscillator, a movement amount of a nozzle, or a current supplying to a VCM, these waveforms during the joining are compared with waveforms of good joining thereof and then the good or defective is determined. According to the above constructions, the good or defective of the joining between the electronic component and the circuit board can be determined during the joining. Further, when a joining state becomes wrong during the joining, the joining state can be changed. Thus generation of defective components is prevented and a yield can be improved.

40 Claims, 25 Drawing Sheets

U.S. PATENT DOCUMENTS 4,815,001 A * 3/1989 Uthe et al.
5,213,249 A * 5/1993 Long et al.
5,357,423 A * 10/1994 Weaver et al.
5,431,324 A * 7/1995 Kajiwara et al.
5,645,210 A * 7/1997 Toner et al.
5,669,545 A * 9/1997 Pham et al.
6,039,234 A * 3/2000 Toner
6,189,760 B1 * 2/2001 Gotoh et al.

* cited by examiner

BUMP JOINING JUDGING DEVICE AND METHOD, AND SEMICONDUCTOR COMPONENT PRODUCTION DEVICE AND METHOD

TECHNICAL FIELD

The present invention relates to an apparatus and a method for deciding whether a bump formed on either one of an electronic component and a circuit board is joined good to an electrode portion of the other, for example, when the bump formed on an electrode of the electronic component is connected to an electrode part on the circuit board to manufacture a semiconductor component, and an apparatus with the bump joining determination apparatus and a method for manufacturing semiconductor components.

BACKGROUND ART

In order for electrically connecting and fixing an electronic component onto a circuit board, there is a method whereby bumps formed on either one of the electronic component and the circuit board are joined to electrode portions of the other. The description hereinafter will be directed to a method of joining the bumps formed on electrodes of the electronic component to electrode parts on the circuit board. An apparatus which executes the bump join method is, e.g., a semiconductor component manufacturing apparatus 1 shown in FIG. 30. The semiconductor component manufacturing apparatus 1 roughly comprises a component feed apparatus 2, a bonding stage 3, a component reverse apparatus 4, a bump join apparatus 5, and a circuit board transfer apparatus 6.

The component feed apparatus 2 is an apparatus for feeding semiconductor chips as an example of the aforementioned electronic component. The circuit board transfer apparatus 6 carries a circuit board 20 in and out of the semiconductor component manufacturing apparatus 1. The bonding stage 3 is a stage for loading the circuit board 20 carried in by the circuit board transfer apparatus 6 for the bump joining, which can be moved in a Y-direction by a Y-axis robot 7 and heats the circuit board 20 for the bump joining. The component reverse apparatus 4 holds the semiconductor chip from the component feed apparatus 2 and turns the held semiconductor chip upside down so that bumps formed on electrodes 13 of the semiconductor chip face the circuit board 20 placed on the bonding stage 3. The bump join apparatus 5 includes a holding device for holding the semiconductor chip, a Z-direction driving device 51 for moving the held semiconductor chip in a thickness-direction, and an ultrasonic vibration generating device 9 which will be detailed later. The bump join apparatus 5 is mounted to an X-axis robot 8 and can be moved in an X-direction by the X-axis robot 8. After receiving the semiconductor chip from the component reverse apparatus 4 and transferring it to the bonding stage 3, the bump join apparatus 5 presses the held semiconductor chip by driving the Z-direction driving device 5 to a predetermined position of the circuit board 20 placed on the bonding stage 3, thereby joining the bumps. The bump, before being pressed to an electrode part 21 of the circuit board 20, keeps a shape as shown in FIG. 32, having a diameter I of approximately 100 $\mu$m, a height III at a base part 11a on the electrode 13 of the semiconductor chip 150 of approximately 30–35 $\mu$m, and a total height II of approximately 70–75 $\mu$m. The pressed bump after being crushed (the pressed bump 11 will be denoted by a reference numeral "12" hereinbelow) is shaped as illustrated in FIG. 33. A height IV of the pressed bump 12 is approximately equal to the height III of the base part 11a.

The semiconductor chip to be joined onto the circuit board 20 is located by the X-axis robot 8 and Y-axis robot 7.

The bump join apparatus 5 is equipped with the ultrasonic vibration generating device 9 for vibrating the bumps 11 in the Y-direction or X-direction thereby generating a frictional heat between the bumps 11 and the electrode parts 21 of the circuit board 20, and reducing a heating temperature of the bonding stage 3 to tightly unite the bumps 11. The ultrasonic vibration generating device 9 has, as shown in FIG. 31, piezoelectric elements 91 and an ultrasonic horn 92 having one end part connected to the piezoelectric element 91. Ultrasonic vibration is generated when a voltage is placed to the plurality of the layered piezoelectric elements 91. The generated vibration, for instance, in the Y-direction is amplified by the ultrasonic horn 92. A nozzle 93 for holding the semiconductor chip 150 is fixed to the other end part of the ultrasonic horn 92. The above vibration of the piezoelectric elements 91 vibrates the nozzle 93, namely, semiconductor chip 150 held by the nozzle 93 in the Y-direction. Although the piezoelectric elements 91 vibrate, e.g., in the Y-direction, vibrations in various directions are generated in a process while the generated vibration being transmitted to the semiconductor chip 150. Therefore, the semiconductor chip 150 vibrates actually in various directions although it primarily vibrates in the Y-direction.

In the above-described conventional semiconductor component manufacturing apparatus 1, after the bumps 11 of the electronic component are pressed to the circuit board 20 heated to approximately 150° C. on the bonding stage 3, the bumps 11 are ultrasonically vibrated via the electronic component, whereby the frictional heat is generated between the bumps 11 and electrode parts 21 to join the bumps and electrode parts.

Joining the bumps 11 and electrode parts 21 in this manner allowed portable telephones and personal computers to be made more compact and light-weight. However, whether the joining is good or not was not determined during the joining process in the conventional method. The joining at narrow-pitch electrodes requires a mounting equipment with high accuracy. Further, parts failing in the joining process could not be corrected and products containing such failure must be dumped.

According to the "mounting apparatus for flip chip components" described in the published specification of JP, 07-142545, A, as a prior art, the mounting apparatus was carried out using a method in which a state of bumps and a joining state thereof were confirmed by an infrared image pickup means before and after a flip chip IC was mounted, so that defective components were eliminated and only good components were sent to a next process. According to the prior mounting method, the flip chip IC sucked by a nozzle with a heater was moved and mounted to a predetermined position on the printed board. Immediately following this operation, picking up was performed by the infrared camera from below. Only joined parts of the circuit board were extracted from image data, and a positional deviation and join area of the joined parts were calculated and then compared with a preliminarily set allowance. A mount state was determined accordingly in the method.

On the other hand, in the "mounting apparatus for flip chip components" disclosed in the published specification of JP, 10-075096, A, a quantity and a shape of a conductive adhesive at the bump or a top part of the bump were measured with use of a CCD camera immediately before the flip chip IC was joined to a printed board, thereby deciding whether or not a state of the electrode was good. Only good components were hence joined to the printed board.

In the conventional techniques as above, that is, in the method of extracting the electrode shape of bumps of IC chip or the like with use of the infrared camera or CCD camera and processing images, the join state was able to be determined solely from an appearance such as the shape, area or the like of electrodes. Thus, there was a problem whether or not the bumps and electrode portions were truly joined was not correctly determined through visual inspection on the shape, area or the like.

Moreover, even if it was possible to tell failures by the shape, the failures could not be corrected with manipulation added. As a result, there was a problem that an improvement in yield could not be enhanced.

The present invention is devised to solve the above-described problems and has for its object to provide an apparatus and a method for deciding whether or not bumps formed to either one of an electronic component and a circuit board are joined good to electrode portions of the other during the joining process and moreover, a condition of the joining is changed in the case where a failure is estimated to take place, and to provide an apparatus with the bump joining determination apparatus and a method for manufacturing semiconductor components.

DISCLOSURE OF INVENTION

In order to achieve the aforementioned objective, according to a bump joining determination apparatus as a first aspect of the present invention, there is provided a bump joining determination apparatus for deciding a good or defective of bump joining at a time when electrodes of an electronic component and electrode parts of a circuit board are joined via bumps with the electronic component and the circuit board relatively vibrated so as to manufacture a semiconductor component, the apparatus comprising a vibration damping detect device for detecting damping of the vibration incident to progress of the joining, and a deciding device for deciding whether the joining is good or defective on a basis of the vibration damping detected by the vibration damping detect device.

In the bump joining determination apparatus in the first aspect, the vibration damping detect device may detect an impedance value of a vibration generating device increasing in accordance with the vibration damping with the electronic component and the circuit board relatively vibrated, and the deciding device may determine whether the joining is good or defective on a basis of an increase tendency of the impedance value resulting from the vibration damping.

The above deciding device can be constituted to determine that the joining is good when the impedance value increases in accordance with a lapse of time after a start time of applying the vibration, reaches a balanced value after a necessary join time has passed since the start time, and maintains the balanced value for a stable time after the necessary join time.

The relative vibration to the electronic component and circuit board may be provided by vibrating the electronic component while the circuit board is fixed.

In the above bump joining determination apparatus, the vibration damping detect device may have a width measuring device for measuring a vibration width of the vibration with utilization of a laser light, and the deciding device determines whether the joining is good or defective on the basis of damping in vibration width.

The width measuring device may irradiate the laser light at a right angle to a vibration measurement face and may measure the vibration width on the basis of reflecting light when the relative vibration to the electronic component and circuit board is provided by vibrating the electronic component while the circuit board is fixed.

The vibration damping detect device in the bump joining determination apparatus may further include a vibration constituent current separator connected to the vibration generating device for relatively vibrating the electronic component and circuit board, for separating a vibration constituent current at the vibration generating device, and the deciding device determines whether the joining is good or defective on the basis of the vibration constituent current output from the vibration constituent current separator.

According to a second aspect of the present invention, there is provided a bump joining determination method for deciding whether a bump joining is good or defective at a time when electrodes of an electronic component and electrode parts of a circuit board are joined via bumps with the electronic component and circuit board relatively vibrated, the method comprising detecting damping in the vibration incident to a progress of the joining, and deciding the good or defective of the joining on a basis of the detected vibration damping.

A semiconductor component manufacturing apparatus according to a third aspect of the present invention is provided with the bump joining determination apparatus according to the first aspect.

According to a fourth aspect of the present invention, there is provided a semiconductor component manufacturing apparatus for joining electrodes of an electronic component and electrode parts of a circuit board via bumps with use of ultrasonic vibration so as to manufacture a semiconductor component, the apparatus comprising an impedance output device for making a vibration generating device generate the ultrasonic vibration and for sending an impedance related to the vibration generating device during the joining carried out via the bumps, and a joining determination apparatus for comparing changes in the sent impedance with an impedance of good joining when the electronic component and circuit board are joined well so as to determine whether the joining is good or defective.

The semiconductor component manufacturing apparatus according to the fourth aspect further comprises a pressure control device for making an electronic component hold member hold the electric component and move the electric component hold member in a thickness-direction of the circuit board, and for mounting the electric component onto the circuit board via the bumps while controlling a pressure, and a measuring device for measuring a shift of the electronic component hold member when pressing the electronic component onto the circuit board via the bumps at the pressure control device, so that the joining determination apparatus determines whether the joining is good or defective by further comparing changes in the shift of the electronic component hold member sent by the measuring device with a shift of good joining when the electronic component and circuit board are joined well.

Otherwise, the semiconductor component manufacturing apparatus according to the fourth aspect may be equipped with a pressure control device which makes an electronic component hold member hold the electronic component and moves the electronic component hold member in a thickness-direction of the circuit board so as to mount the electronic component onto the circuit board via the bumps while controlling a pressure, and which sends a pressing force of the electronic component hold member when pressing the electronic component onto the circuit board via the bumps, wherein the joining determination apparatus decides whether the joining is good or defective by further comparing changes in the pressing force of the electronic component hold member sent from the pressure control device with a pressing force of good joining when the electronic component and circuit board are joined well.

The pressure control device in the semiconductor component manufacturing apparatus of the fourth aspect may be adapted to send a pressing force of the electronic component hold member when pressing the electronic component onto the circuit board, the joining determination apparatus further deciding whether the joining is good or defective by comparing changes in the pressing force of the electronic component hold member sent from the pressure control device with a pressing force of good joining when the electronic component and circuit board are joined well.

In the semiconductor component manufacturing apparatus according to the fourth aspect, the joining determination apparatus can make the impedance output device change the ultrasonic vibration to improve a join state between the electronic component and circuit board when deciding the join state is defective during the joining.

In the fourth aspect of the semiconductor component manufacturing apparatus, the joining determination apparatus can make the impedance output device change the ultrasonic vibration to improve the join state between the electronic component and circuit board when deciding the join state is defective during the joining, and moreover, makes the pressure control device change the pressure to improve the join state if the join state is not improved simply by changing the ultrasonic vibration.

The semiconductor component manufacturing apparatus according to a fourth aspect further comprises a first memory for storing changes in the impedance sent from the impedance output device, shift of the electronic component hold member sent from the measuring device, and pressing force of the electronic component hold member sent from the pressure control device, and a second memory for storing changes in the impedance of good joining, the shift of good joining, and the pressing force of good joining, wherein the joining determination apparatus decides whether the joining is good or defective by comparing changes in the sent impedance with the impedance of good joining, shift of the electronic component hold member and shift of good joining, and pressing force of the electronic component hold member and pressing force of good joining stored in the first memory and the second memory respectively.

In the semiconductor component manufacturing apparatus according to the fourth aspect, the apparatus may further comprise a display device for displaying judgment results by the joining determination apparatus, and a third memory for storing a change in impedance when the joining determination apparatus determines that the electronic component and circuit board are joined defectively, wherein the joining determination apparatus makes the display device display the change in impedance when deciding that the electronic component and circuit board are joined defectively, and also makes the third memory store the change in impedance.

According to a fifth aspect of the present invention, there is provided a semiconductor component 25 manufacture method for manufacturing a semiconductor component by joining electrodes of an electronic component and electrode parts of a circuit board via bumps with use of ultrasonic vibration, the method comprising comparing a change in impedance related to generation of the ultrasonic vibration from a start to an end of joining between the electrodes and electrode parts with a change in impedance of good joining from the start to the end when the electronic component and circuit board are joined well, and deciding whether or not the joining is good based on the comparison.

In the semiconductor component manufacture method according to the fifth aspect, the method may further comprise applying the ultrasonic vibration, and moving and pressing the electronic component and circuit board to close each other via the bumps in a thickness-direction of the circuit board, in addition to the comparison of changes in the sent impedance with impedance of good joining, further executing at least one comparison of a change in shift between the electronic component and circuit board from the start to the end with a change in shift of good joining when the electronic component and circuit board are joined well from the start to the end, and a change in pressing force between the electronic component and circuit board from the start to the end with a change in pressing force of good joining from the start to the end when the electronic component and circuit board are joined well is conducted, and deciding whether or not the joining is good based on the comparison.

In the semiconductor component manufacture method according to the fifth aspect, the method may further comprises:

applying the ultrasonic vibration, and moving and pressing the electronic component and circuit board to close each other via the bumps in a thickness-direction of the circuit board;

in addition to the comparison of changes in the sent impedance with impedance of good joining, further executing at least one comparison of a change in shift between the electronic component and circuit board from the start to the end with a change in shift of good joining when the electronic component and circuit board are joined well from the start to the end, and a change in pressing force between the electronic component and circuit board from the start to the end with a change in pressing force of good joining from the start to the end when the electronic component and circuit board are joined well is conducted; and deciding whether or not the joining is good based on the comparison.

Moreover, in the method of the fifth aspect, the ultrasonic vibration may be changed to improve a join state between the electronic component and circuit board when the join state is determined as defective during the joining.

Alternatively, according to the semiconductor component manufacture method in the fifth aspect, the pressing force between the electronic component and circuit board from the start to the end of joining when the electronic component and circuit board are moved in the thickness-direction of the circuit board via the bumps to be close to each other may be changed to improve the join state when the join state is not improved simply by changing the ultrasonic vibration.

In the constitution as above, according to the bump joining determination apparatus in the first aspect and the bump joining determination method in the second aspect of the present invention, the vibration damping detect device and deciding device are set to detect the vibration damping incident to the progress of the joining between the bumps and electrode parts or between the bumps and electrodes, thereby deciding based on the vibration damping whether or not the joining is good. The joining can be accordingly determined during the execution of the joining.

The semiconductor component manufacturing apparatus of the third aspect of the present invention features the bump joining determination apparatus and method of the above first and second aspects, so that the joining between the electronic component and circuit board can be determined while the joining is being carried out.

For the semiconductor component manufacturing apparatus in the fourth aspect and the semiconductor component manufacture method in the fifth aspect of the present invention are prepared the impedance output device, pressure control device, measuring device and joining determination apparatus are prepared, so that the ultrasonic impedance, downward shift and pressure of the electronic component hold member are measured in real time during the joining, whose waveform data are compared with waveform data of good joining, thus enabling detection of a defective join state.

Additionally, the display device for displaying judgment results and the third memory device for storing waveform data of defective joining are set. If the joining is determined as defective, the semiconductor component manufacturing apparatus is stopped, waveform data of the defective component is displayed by the display device, the defective component is removed and only good components are sent to a next process. Thus a join quality can be improved accordingly.

In the case where it is determined as defective during the joining by the joining determination apparatus, the joining determination apparatus monitors waveform data during the joining in real time, changes the voltage to be supplied to the impedance output device to change the ultrasonic vibration or changes the pressure value of the pressure control device, or changes both the voltage and the pressure value to change the join condition. Generation of defective components is thus prevented and a yield can be improved.

BRIEF DESCRIPTION OF DRAWINGS

These and other objects and features of the present invention will become clear from the following description taken in conjunction with the preferred embodiments thereof with reference to the accompanying drawings in which.

BEST MODE FOR CARRYING OUT THE INVENTION

Figure 1:
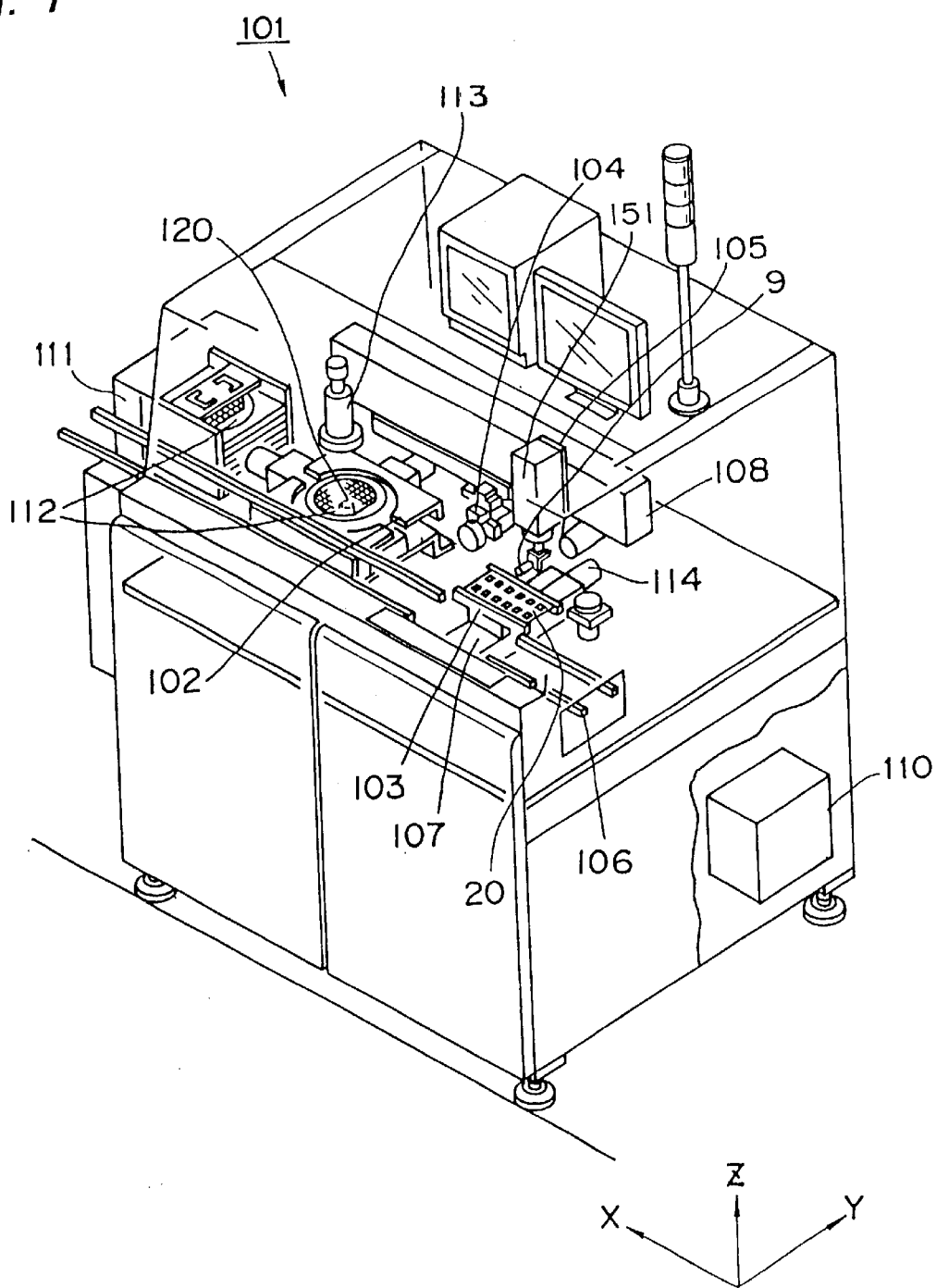
FIG. 1 is a perspective view of an example of a semiconductor component manufacturing apparatus according to an embodiment of the present invention.

A bump joining determination apparatus, a bump joining determination method executed by the bump joining determination apparatus, a semiconductor component manufacturing apparatus with the bump joining determination apparatus, and a semiconductor component manufacture method carried out by the semiconductor component manufacturing apparatus according to preferred embodiments of the present invention will be described below with reference to the drawings. It is to be noted that like parts are designated by like reference numerals through the drawings.

According to the embodiments, a semiconductor chip will be adopted as an example of the "electronic component" depicted in the above "SUMMARY OF THE INVENTION", which is obtained by forming integrated circuits on a semiconductor substrate such as a silicon wafer or the like, forming bumps to electrodes of the integrated circuit and cutting separately to each integrated circuit part. However, the electronic component is not limited to the semiconductor chip. For example, a chip component or the like can be adopted, which has the above semiconductor chip sealed by resin and having bumps on electrodes of the above semiconductor chip.

A component current separator according to a second embodiment and a width measuring device according to a third embodiment correspond by way of example to the "vibration damping detect device" described in the "SUMMARY OF THE INVENTION". However, the detect apparatus is not limited to these apparatuses.

A control device according to the second and third embodiments is an example functioning as the "deciding device" described in the "SUMMARY OF THE INVENTION". The deciding device is not restricted to this.

Further, according to the embodiments, an ultrasonic vibration generating device 9 set to a bump join apparatus 105 and including piezoelectric elements 91 functions as an example of the "vibration generating device" in the "SUMMARY OF THE INVENTION". The vibration generating device is not specifically limited to this.

With respect to vibrations, any form of vibration can do so long as it generates a frictional heat between the bump and electrode part of the circuit board thereby lowering a heating temperature for the circuit board by a bonding stage. The vibration is not restricted to the ultrasonic vibration. An amplitude is approximately 0.5 $\mu$m at minimum.

Figure 16:
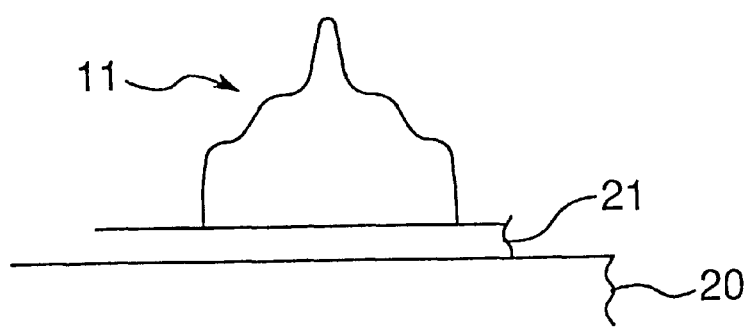
FIG. 16 is a diagram of a bump when formed on an electrode part of a circuit board.

In the embodiments to be described hereinbelow, the bumps are formed on the electronic component, which are joined to the electrode parts on the circuit board to produce a semiconductor component. However, the bump joining determination apparatus and method, and the semiconductor component manufacturing apparatus according to the embodiments of the present invention are not limited to this case. That is, the bump joining determination apparatus and method, and the semiconductor component manufacturing apparatus according to the embodiments of the present invention are applicable to joining the bumps formed on either one of the electronic component and the circuit board to the electrode portions of the other, including a case opposite to the above, i.e., wherein a bump 11 is formed. on an electrode part 21 on a circuit board 20 as shown in FIG. 16.

First Embodiment

As shown in FIG. 1, a semiconductor component manufacturing apparatus 101 having a bump joining determination apparatus according to the above embodiment is constructed fundamentally similarly to the semiconductor component manufacturing apparatus 1 described earlier. However the semiconductor component manufacturing apparatus 101 features to have a control device 110 for executing a bump joining determination method to be described in detail later. Specifically, the semiconductor component manufacturing apparatus 101 roughly comprises a component feed apparatus 102, a bonding stage 103, a component reverse apparatus 104, a bump join apparatus 105, a circuit board transfer apparatus 106, and the control device 110. The component feed apparatus 102 corresponds to the earlier described conventional component feed apparatus 2, the bonding stage 103 corresponds to the conventional bonding stage 3, the component reverse apparatus 104 corresponds to the conventional component reverse apparatus 4, the bump join apparatus 105 corresponds to the conventional bump join apparatus 5, the circuit board transfer apparatus 106 corresponds to the conventional circuit board transfer apparatus 6. Detailed description for the component feed apparatus 102, bonding stage 103, component reverse apparatus 104, bump join apparatus 105 and circuit board transfer apparatus 106 will be omitted here except supplemental remarks hereinbelow.

To the component feed apparatus 102 is supplied a semiconductor wafer 112 from a magazine lifter 111. The semiconductor wafer 112 has bumps 11 formed on electrodes 13 of integrated circuits formed thereon and is scribed to individual integrated circuit parts as described earlier. The component feed apparatus 102 performs expansion of wafer 112 and divides the wafer 112 to the individual semiconductor chips. An image of a state of the wafer 112 supplied to the component feed apparatus 102 and an image of a state of each semiconductor chip are picked up by a wafer recognize apparatus 113 set above the component feed apparatus 102. Then the picked-up information are supplied to the control device 110. Since the semiconductor chip is exemplified as the electronic component according to the embodiment as mentioned before, the manufacturing apparatus has the component feed apparatus 102 of this form. However, the component feed apparatus is consequentially changed in form in accordance with a difference in form of electronic components to be processed.

Naturally, a circuit formation part with the bumps of the wafer 112 is directed upside. Each of the divided semiconductor chips is pushed up in a thickness-direction of the chip by a push device 120 included in the component feed apparatus 102, then held by the component reverse apparatus 104 one by one to be turned upside down so that the bumps are opposed to electrode parts 21 of the circuit board 20.

In the embodiment, the wafer 112 has a substrate formed of $LiTaO_3$, $LiNbO_3$ or the like, which are so-called ferroelectrics. A material for the bump is gold.

Figure 3:
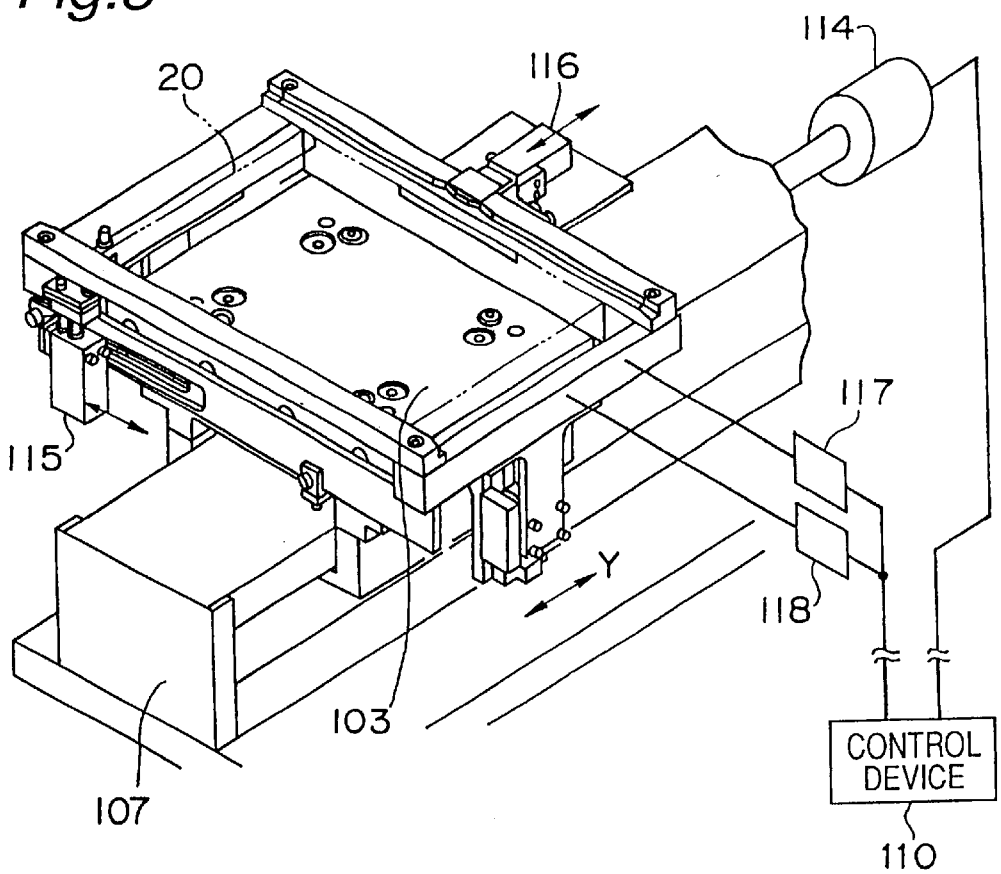
FIG. 3 is an enlarged perspective view of a bonding stage part in FIG. 1.

As shown in FIG. 3, the bonding stage 103 is slid in a Y-direction by a Y-axis robot 107 having a ball screw structure which has a motor 114 as a driving part. Further, the bonding stage 103 has a substrate regulate part 115 and a substrate regulate part 116 in order to load the circuit board 20 on the bonding stage 103 corresponding to a size of the circuit board 20 supplied from the circuit board transfer apparatus 106. The substrate regulate part 115 is movable in an X-direction for holding a peripheral edge part in the Y-direction of the circuit board 20. The substrate regulate part 116 is movable in the Y-direction for holding a peripheral edge part in the X-direction of the circuit board 20. The bonding stage 103 has also a suction channel formed for sucking and holding the circuit board 20. The suction channel communicates with a sucking apparatus 117. Moreover, the bonding stage 103 has a heating device 118 for heating the circuit board 20 to approximately 150° C. for joining the bumps.

As described before with reference to FIG. 31, the bump join apparatus 105 has at its lower end part an ultrasonic vibration generating device 9 and a nozzle 93 which is an example functioning as an electronic component hold member for holding the semiconductor chip. The piezoelectric elements 91 constituting the ultrasonic vibration generating device 9 are connected via an oscillator 133 to the control device 110. The control device 110 detects a change in impedance of the piezoelectric elements 91, thereby deciding whether or not the joining of the bumps 12 with the electrode parts 21 is good, which will be detailed later.

Figure 2:
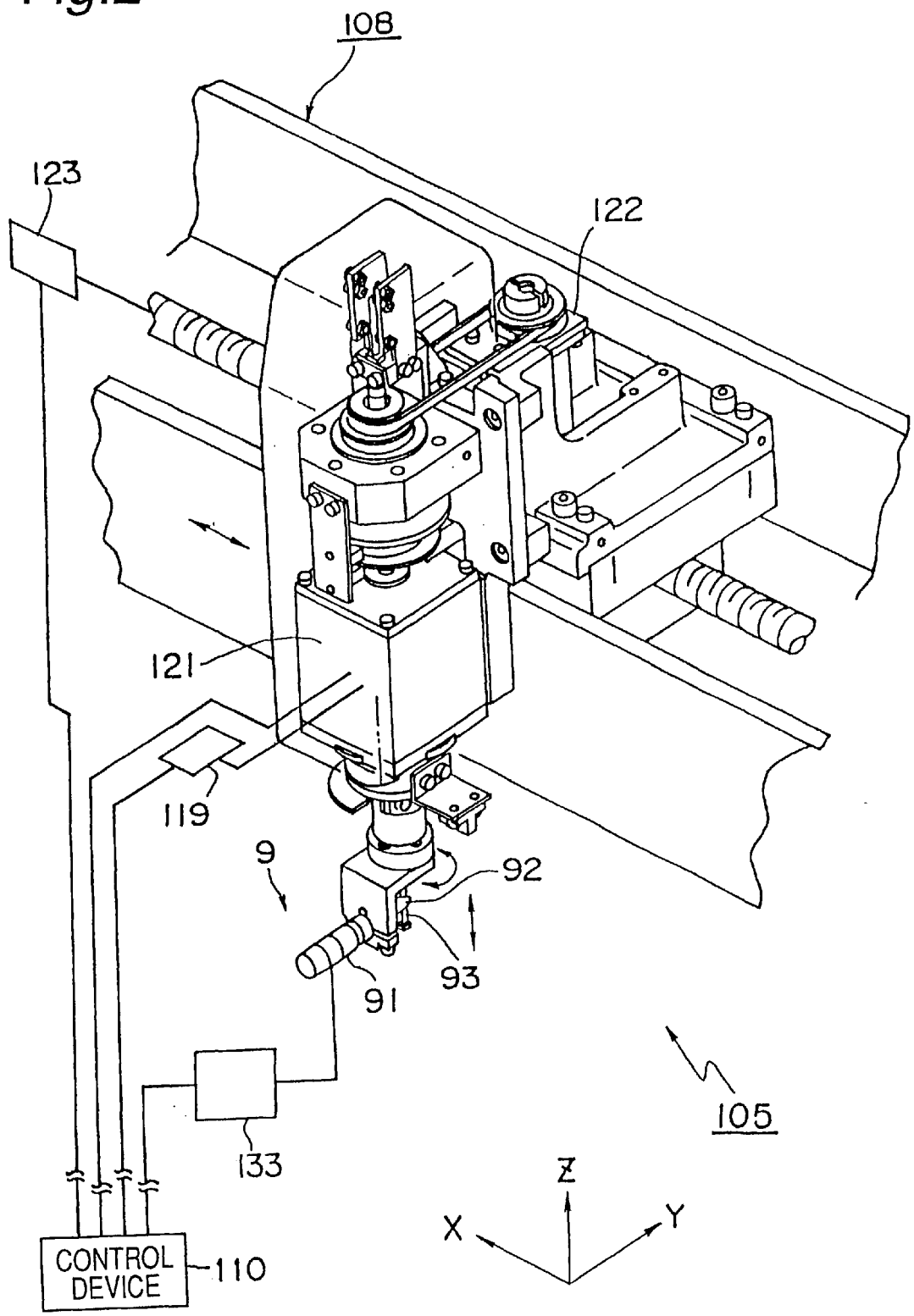
FIG. 2 is an enlarged perspective view of a bump join apparatus part in FIG. 1.
Figure 31:
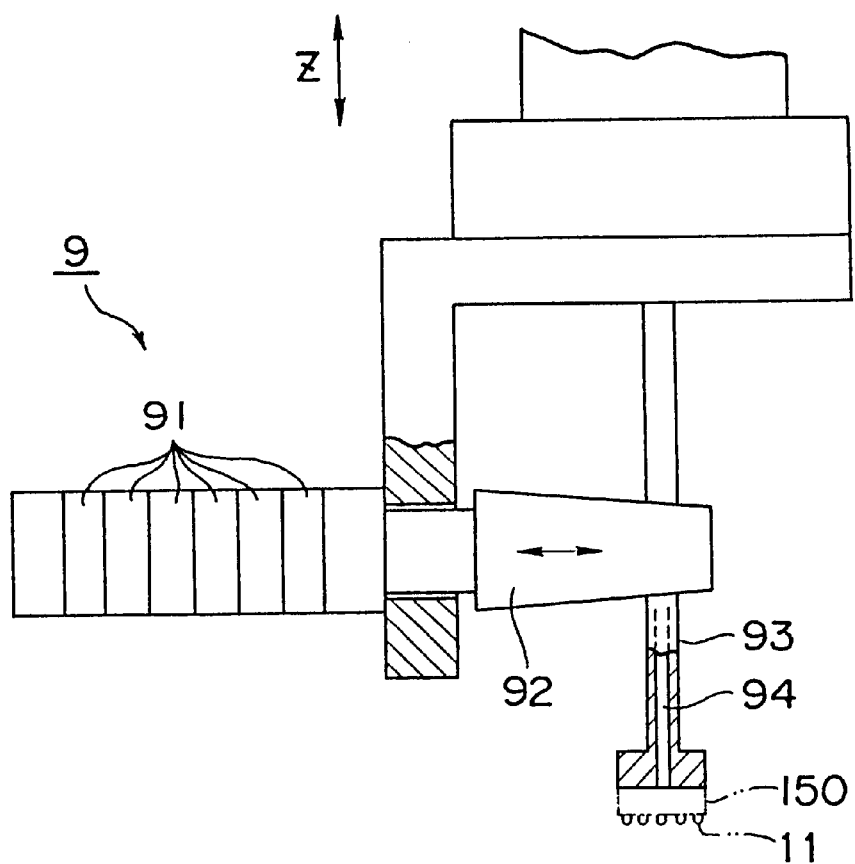
FIG. 31 is a diagram showing a holding part for semiconductor chips and a vibration generating device part in a bump join apparatus.

As is clearly shown in FIG. 31, in the embodiment, the nozzle 93 has a suction channel 94 for sucking and holding the semiconductor chip 150. The suction channel 94 is formed in an axial direction of the nozzle 93 inside the nozzle to communicate with a sucking apparatus 119. A way of holding the semiconductor chip 150 is not restricted to the aforementioned sucking, and a mechanical constitution may be possible. According to the embodiment, for joining the bumps 11 with the electrode parts 21 of the circuit board 20, the bumps 11 are faced to the electrode parts 21 and then the semiconductor chip 150 is moved in a direction to bring the bumps 11 closer to the electrode parts 21 (Z direction in the embodiment). Then the bumps 11 and electrode parts 21 are pressed. For this, a known voice coil motor (VCM) 121 as shown in FIG. 2 is used in the embodiment as a driving device for moving and pressing the semiconductor chip 150. Moreover, the bump join apparatus 105 has a motor 122 for rotating the nozzle 93 about its axis. The operation of the bump join apparatus 105 is controlled by the control device 110.

An X-axis robot 108 for moving the bump join apparatus 105 in the X-axis direction is constituted in a ball screw structure according to the embodiment, as shown in FIG. 2, having a motor 123 as a driving part.

The control device 110 is electrically connected to the above-described apparatuses, for example, component feed apparatus 102, bonding stage 103, component reverse apparatus 104, bump join apparatus 105 including the voice coil motor 121 and the piezoelectric elements 91, circuit board transfer apparatus 106 and the like, thereby controlling the operation of each apparatus. In the present embodiment, one control device 110 is set for the whole of the semiconductor component manufacturing apparatus 101 to control, e.g., the bump join operation or the like. Needless to say, a separate control device can be set for each apparatus, for instance, for the bump join apparatus 105 to control the bump joining determination operation of deciding whether or not the bumps are joined good.

The bump joining determination operation carried out by the control device 110 which is a characteristic control operation in the embodiment will be discussed in detail with reference to FIG. 7. The control by the control device 110 on operations of the other apparatuses is the same as in the prior art, and the description thereof will be omitted.

Figure 7:
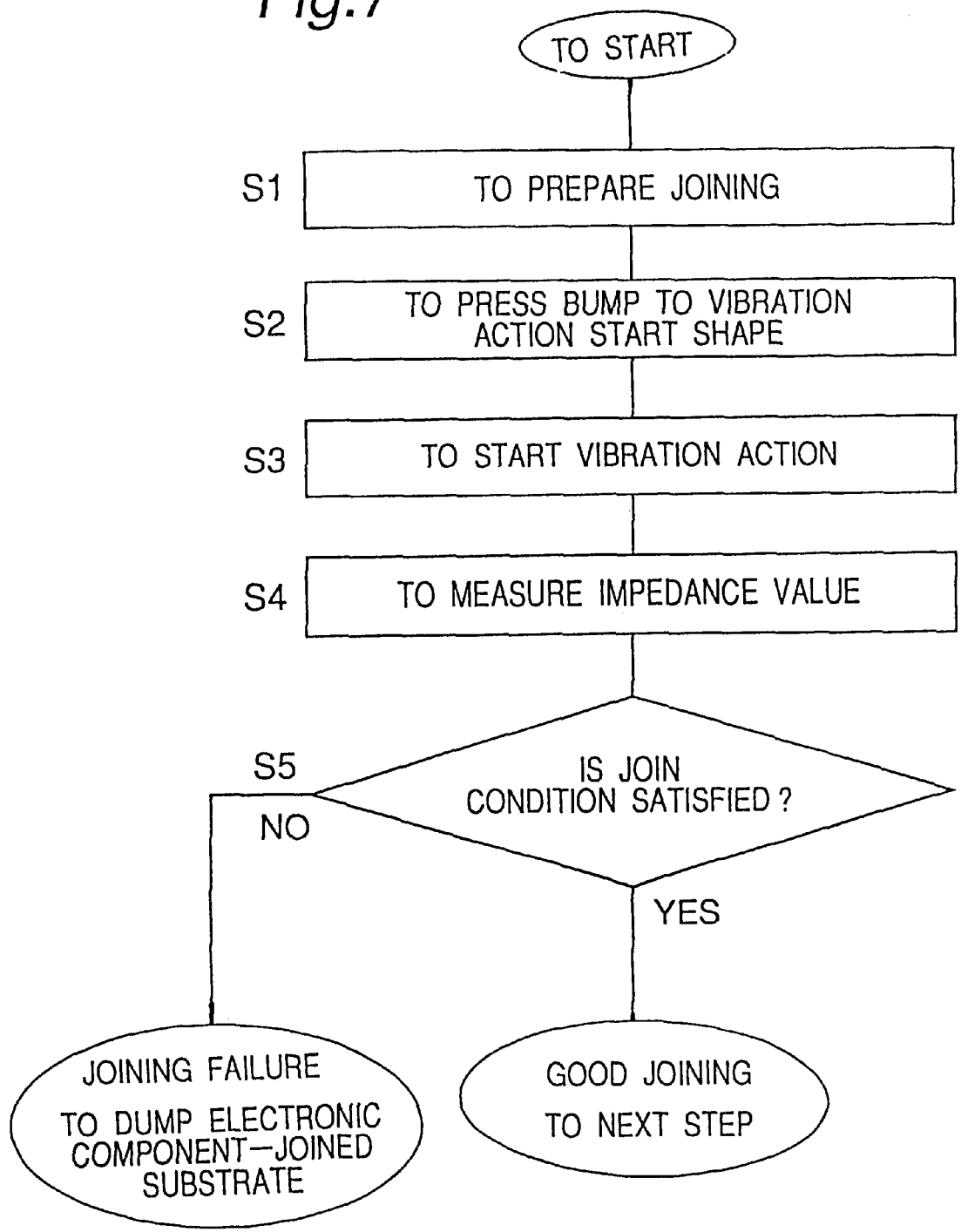
FIG. 7 is a flow chart of an operation in a bump joining determination method executed by the semiconductor component manufacturing apparatus of FIG. 1.
Figure 33:
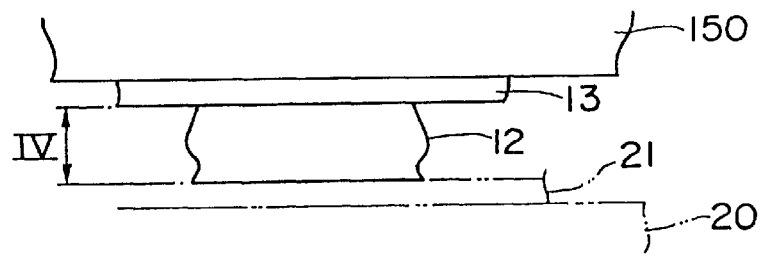
FIG. 33 is a diagram of a state in which a pressed bump reaches a joining completion contact area.

In step (represented by "S" in the drawings) 1 in FIG. 7, the control device 110 controls operations of the X-axis robot 108 and Y-axis robot 107 to arrange the bumps 11 to be opposite to the electrode parts 21 to be joined. In step 2, the control device 110 drives the voice coil motor 121 to bring the bumps 11 and electrode parts 21 in touch with each other and press the bumps 11 to the electrode parts 21. The bumps 11 are turned into forms of the bumps 12 shown in FIG. 33. In step 3, the ultrasonic vibration generating device 9 is driven when the bumps 11 reach state of the bumps 12, thereby acting an ultrasonic vibration to the bumps 12. At this time, the bumps 12 are not pressed more and keep the shape. The ultrasonic vibration to the bumps 12 is generated by supplying a current, a voltage to the piezoelectric elements 91 from the oscillator 133. The ultrasonic vibration acting to the bumps 12 has a frequency 60 KHz generated at the piezoelectric elements 91 of the ultrasonic vibration generating device 9 in the embodiment, whereby an amplitude of 1–2 $\mu$m is obtained at a hold part of the semiconductor chip 150 by the nozzle 93.

While the ultrasonic vibration is being applied to the bumps 12, the oscillator 133 tries to supply the current, voltage constantly to the piezoelectric elements 91. However, since the circuit board 20 is heated and the frictional heat is generated because of the action of the ultrasonic vibration, the bumps 12 gradually are being joined to the electrode parts 21 and consequently become harder to vibrate. To become harder to vibrate bumps 12 as above suppresses the vibration generated at the piezoelectric elements 91. As a result, a value of the current supplied from the oscillator 133 to the piezoelectric elements 91 gradually decreases. On the other hand, since the voltage applied to the piezoelectric elements 91 is theoretically constant, an impedance value at the piezoelectric elements 91 gradually increases according to the Ohm's law when the bumps 12 become hard to vibrate, in other words, in accordance with the progress of the joining of the bumps 12 to the electrode parts 21.

According to the embodiment, the control device 110 detects a change in current supplied to the piezoelectric elements 91 from the oscillator 133 in step 4, thereby obtaining a change in impedance, based on which whether or not the bumps 12 and the electrode parts 21 are joined good is determined in step 5.

Figure 4:
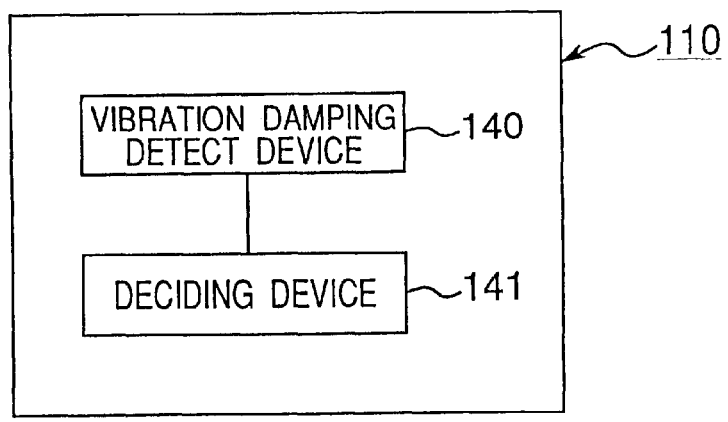
FIG. 4 is a block diagram showing the constitution of a control device in FIG. 1.

The above will be more fully described. The control device 110 functionally includes a vibration damping detect device 140 and a deciding device 141 as indicated in FIG. 4. The vibration damping detect device 140 of the embodiment detects the change in impedance at the piezoelectric elements 91 on the basis of the value of the current supplied to the piezoelectric elements 91 from the oscillator 133 as described above, thereby detecting damping of the vibration of the bumps 12. The deciding device 141 determines on the basis of the vibration damping detected by the vibration damping detect device 140 whether or not the joining of the bumps 12 and electrode parts 21 is good.

The determination operation will be discussed in a more detailed manner. The determination operation described hereinbelow is carried out under the following conditions in the embodiment. Although concrete numerical values described below will be changed when the conditions change, the technical concept of the embodiment is applicable. The semiconductor chip 150 used in the embodiment has 20 bumps 11 of gold in total and, the electrode parts 21 to which the bumps 11 are pressed are also formed of gold. The nozzle 93 of the bump join apparatus 105 is formed of stainless steel, holding the semiconductor chip 150 by sucking. Further, the semiconductor chip 150 has the substrate formed of $LiTaO_3$, $LiNbO_3$ or the like, which are so-called ferroelectrics. A load of 2000 g is applied to the semiconductor chip 150 when the bumps are shaped to the bumps 12.

Figure 5:
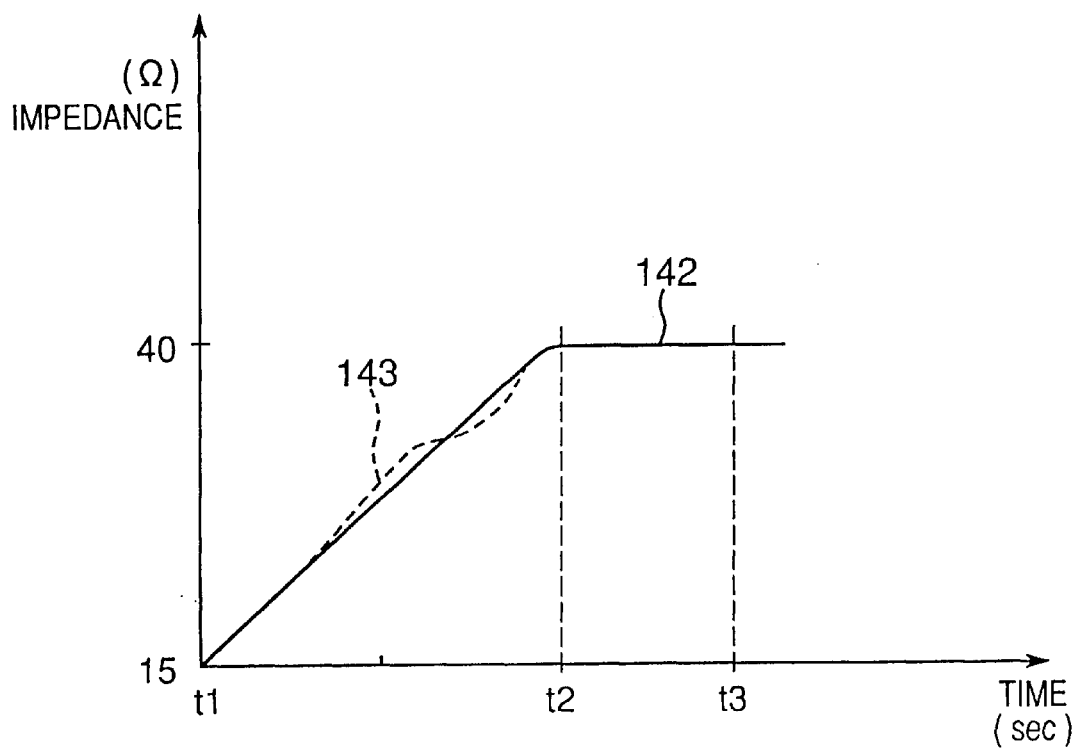
FIG. 5 is a graph showing a change in impedance value supplied to the control device of FIG. 1 in the case of good joining.

The impedance value changes as is represented by a graph 142 in FIG. 5. More specifically, the impedance value is approximately 15 ohm at a time point t1 when the ultrasonic vibration starts acting to the bumps 12, and approximately 40 ohm at a time point t2 when it can be determined that the joining of the bumps 12 and electrode parts 21 completes. According to the embodiment, a time interval from the time point t1 to the time point t2 is approximately 0.1–0.2 second. The impedance value is maintained at a balanced value when the joining completes.

From the above, the deciding device 141 determines the bumps 12 and the electrode parts 21 are joined well when all conditions shown below are satisfied. In the present embodiment, the conditions of that the impedance value increases in accordance with the lapse of time after the start of the ultrasonic vibration acting to the bumps 12, that the impedance value reaches the balanced value at a time point which a necessary join time lapses after the start of the ultrasonic vibration, and that the balanced value is maintained for a stable time after the necessary join time has passed are established.

The necessary join time referred to above is a time necessary for well joining the bumps 12 with the electrode parts 21 after the ultrasonic vibration is started to the bumps 12, which varies depending on various conditions as will be described below. The necessary join time corresponds to ⅓–⅔ a total time of the necessary join time and the stable time, concretely, from the time point t1 to the time point t2 in the embodiment. The necessary join time changes depending on the number of bumps, a size of the bump, a pressing force to the bumps set to the semiconductor chip 150 and the heating temperature or the like. Practically, the necessary join time is measured and determined beforehand through experiments or the like. The above-mentioned "to join well" realizes a join state in which the electrode part 21 of the circuit board 20 and the bump 12 are joined with an intensity equal to or larger than a join intensity of an electrode 13 of the semiconductor chip 150 and the bump 12. For instance, in the case of the bump 12 of a diameter of nearly 100 μm, the join intensity of 60–70 g/bump can be the "good joining".

The stable time corresponds to a time interval from the time point t2 to a time point t3 in FIG. 5 and is set to 0.1 sec in the embodiment.

The balanced value is preliminarily measured and determined simultaneously when the necessary join time is obtained through experiments or the like as discussed above. The judgment that the impedance value reaches the balanced value is made when the impedance value is included within approximately 10% of the preliminarily set balanced value. In the embodiment, the balanced value is 40 ohm. So, it is so constructed that it is determined that the impedance value reaches the balanced value when the impedance value is included within 40±3 ohm.

The graph 142 schematically illustrates the impedance change. The impedance value actually minutely changes and shows the change as indicated by the graph 142. The impedance value almost linearly changes from the time point t1 to the time point t2 with a constant increase rate in the graph 142. However, the impedance value may change, for example, with the increase rate varied as shown by a graph 143.

When the impedance value reaches the balanced value within the necessary join time and maintains the balanced value afterwards, if the ultrasonic energy were continuously applied after the completion of the joining, an excessive energy would act to the join part to deteriorate the join part. Therefore, according to the embodiment, a time corresponding to ⅓–⅔ the total time of the necessary join time and stable time as above is set to be the necessary join time and the remainder of the total time is set to be the stable time.

Figure 6:
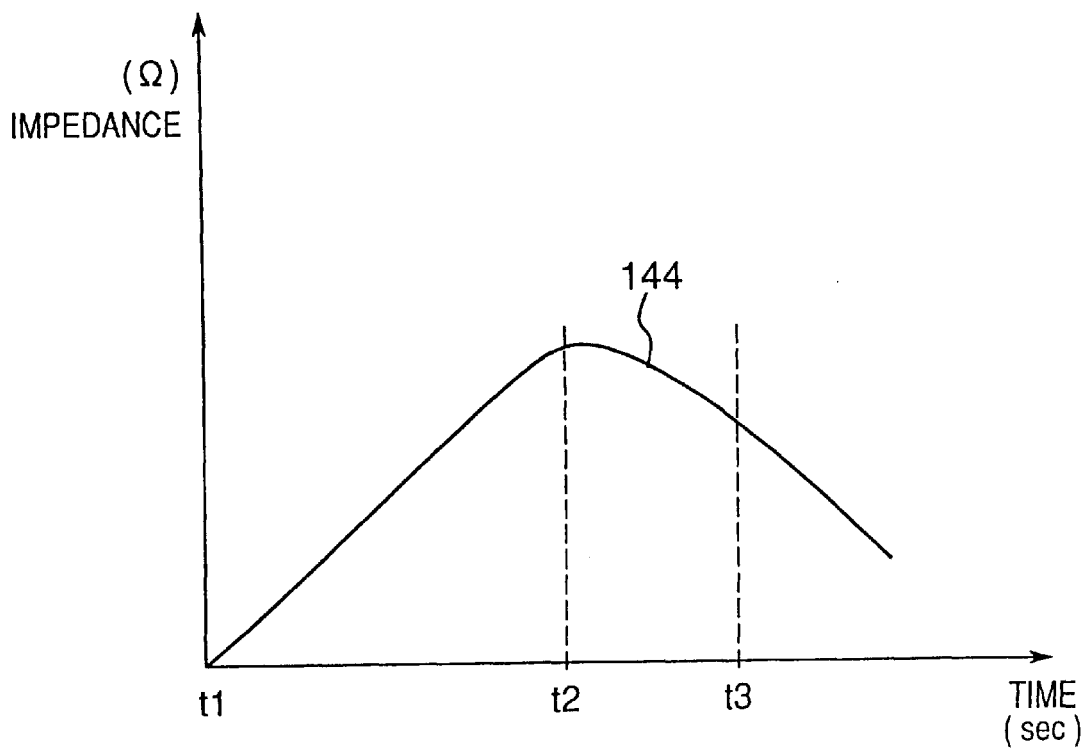
FIG. 6 is a graph showing a change in impedance value supplied to the control device of FIG. 1 in the case of defective joining.

Based on the above criterion of determination, the deciding device 141 determines that the joining is not carried out good, for example, if the impedance value does not keep the balanced value for the stable time as indicated by a graph 144 in FIG. 6.

Although the voice coil motor 121 is employed as the driving device for moving the semiconductor chip 150 for the pressing operation in the embodiment, the device is not limited to the voice coil motor and can be, e.g., a ball screw structure.

The operation in the semiconductor component manufacturing apparatus 101 constituted as above will be described now.

The circuit board 20 is supplied by the circuit board transfer apparatus 106 to the bonding stage 103, and heated while being sucked onto the bonding stage 103. In the meantime, the wafer 112 is transferred from the magazine lifter apparatus 111 to the component feed apparatus 102 and expanded by the component feed apparatus 102. The semiconductor chips 150 are held one by one by the component reverse apparatus 104 from the component feed apparatus 102 and turned upside down. Thereafter, the X-axis robot 108 is driven to move the bump join apparatus 105 to a position corresponding to the component reverse apparatus 104. The reversed semiconductor chip 150 is held by the nozzle 93 of the bump join apparatus 105. After the holding, the X-axis robot 108 is driven again to move the bump join apparatus 105 to above the bonding stage 103. The X-axis robot 108 and Y-axis robot 107 are driven to arrange the bumps 11 of the semiconductor chip 150 to face the electrode parts 21 at a point where the semiconductor chip 150 is to be joined on the circuit board 20 held by the bonding stage 103. The joining operation for the bumps 12 and electrode parts 21 is conducted thereafter and the joining is determined by the control device 110.

After all semiconductor chips 150 are completely joined on the circuit board 20, the bonding stage 103 is moved to the circuit board transfer apparatus 106 which then transfers the circuit board 20 to a next process. At this time, the circuit board 20 which includes semiconductor chips 150 determined as defectively joined is separated from good ones and handled to be discarded or the like.

As described above, according to the bump joining determination apparatus and the bump joining determination method of the embodiment, the impedance value of the piezoelectric elements 91 in the above joining action is measured by the control device 110, and whether or not the bumps 12 and the electrode parts 21 are joined well is determined on the basis of the change in the impedance value. Therefore, the judgment whether the joining is good or not can be made during the execution of the joining.

Figure 8:
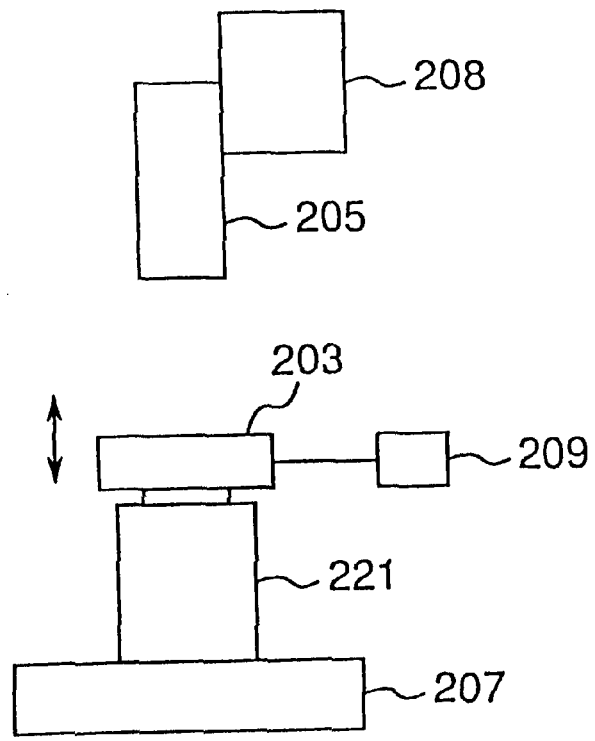
FIG. 8 is a diagram indicating the periphery of the bump join apparatus and the bonding stage in a different example of the constitution of the semiconductor component manufacturing apparatus of FIG. 1.

In the above-described embodiment, although the bumps 11 are moved towards the circuit board 20 so as to press the bumps 11 and the electrode parts 21, the present invention is not limited to this arrangement. For instance, as indicated in FIG. 8, while a bump join apparatus 205 is fixed when the joining is performed, a bonding stage 203 loading the circuit board 20 can be moved to the bump join apparatus 205. For a driving device for moving the bonding stage, for example, a voice coil motor 221 similar to the above-described one may be used and an amount of movement of the bonding stage 203 can be controlled by a current supplied to the voice coil motor 221. In other words, the bumps 11 and the electrode parts 21 are moved relatively in the joining process. A reference numeral 207 and a reference numeral 208 in FIG. 8 respectively indicate a Y-axis robot and an X-axis robot.

The ultrasonic vibration may not be applied to the nozzle 93. Instead, the circuit board 20 may be ultrasonically vibrated by an ultrasonic vibration generating device 209 as shown in FIG. 8. Thus, the bumps 11 and circuit board 20 should be vibrated relatively.

Figure 9:
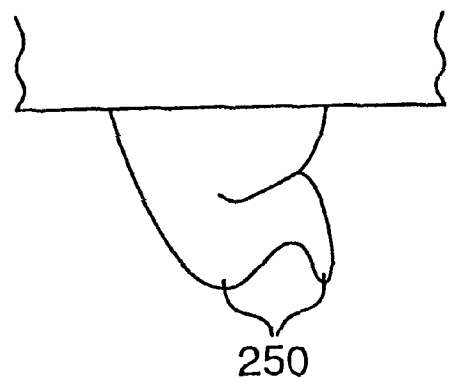
FIG. 9 is a diagram of another example of a shape of a bump.
Figure 32:
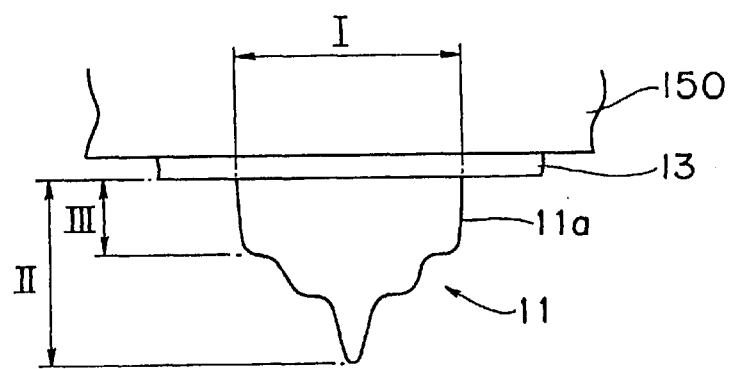
FIG. 32 is a diagram showing a shape of a bump formed on an electronic component.

According to the above embodiment, the bumps 11 are formed to the semiconductor chip 150 in a shape as illustrated in FIG. 32. The bump is not limited to the bump 11 and the embodiment is applicable, for example, to a bump having a plurality of top parts 250 as shown in FIG. 9.

Second Embodiment

According to the above first embodiment, damping of the vibration of the semiconductor chip 150 incident to the progress of the joining between the bumps 12 and electrode parts 21 is detected from the change in impedance value of the piezoelectric elements 91, and the control device 110 determines the joining on the basis of the change in impedance value. However, a method for measuring the damping is not limited to the first embodiment.

Figure 10:
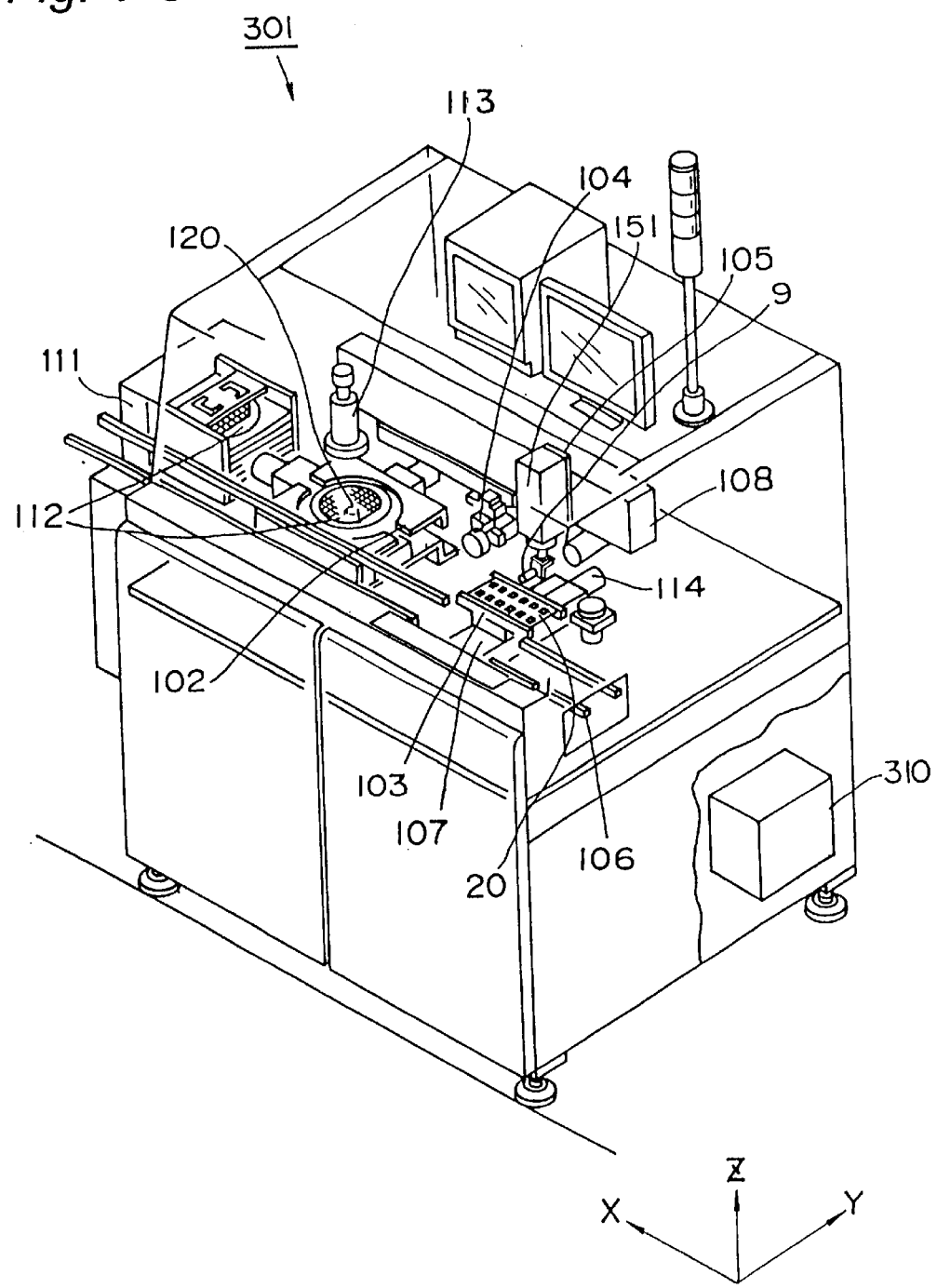
FIG. 10 is a perspective view of a semiconductor component manufacturing apparatus according to a second embodiment of the apparatus in FIG. 1.
Figure 11:
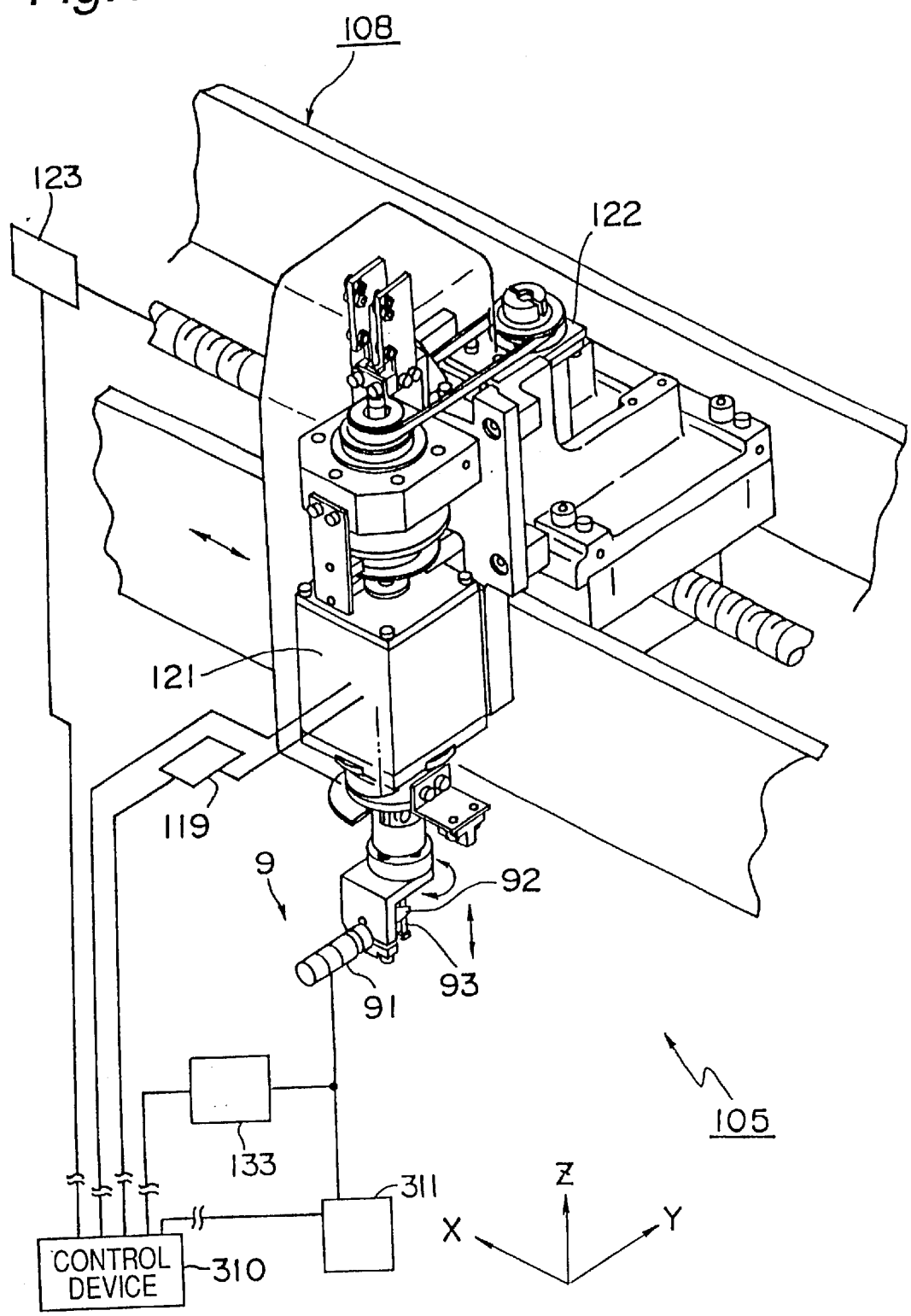
FIG. 11 is a diagram showing a connection relationship of a vibration constituent current separator and a control device of the semiconductor component manufacturing apparatus of FIG. 10.
Figure 12:
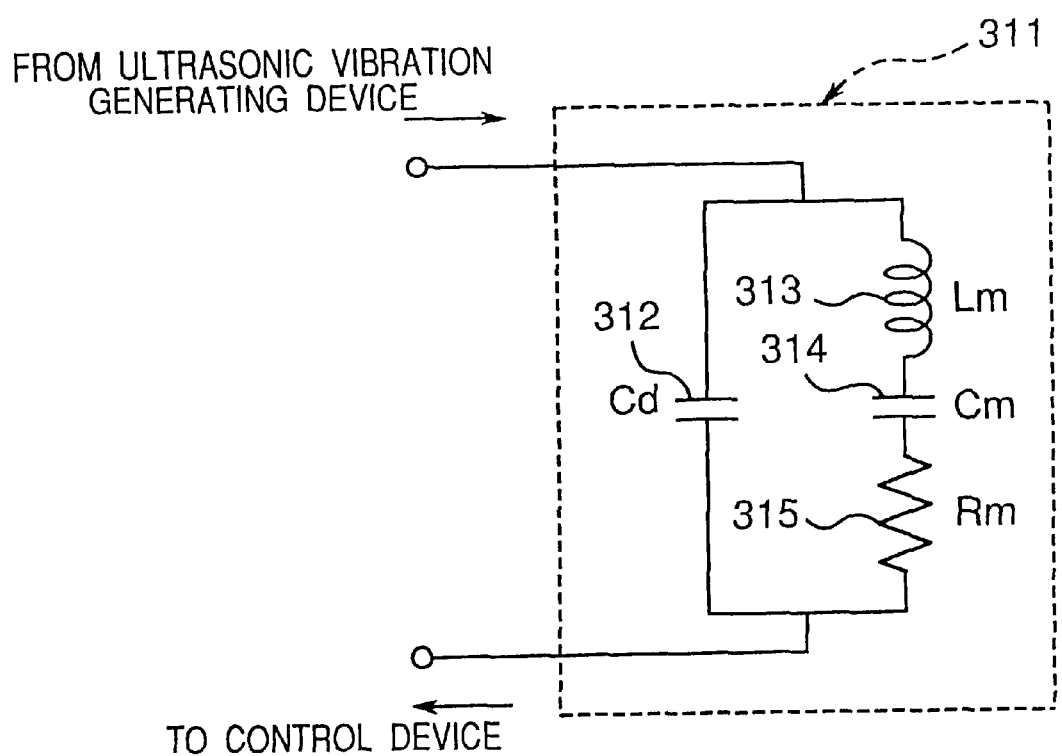
FIG. 12 is an equivalent circuit diagram of the vibration constituent current separator of FIG. 11.

For example, according to a semiconductor component manufacturing apparatus 301 shown in FIGS. 10–12, there are arranged a control device 310 and a vibration constituent current separator 311. A current supplied to oscillating elements 91 of the ultrasonic vibration generating device 9 is separated by the vibration constituent current separator 311 to a vibration constituent current and a heat constituent current, and an impedance at the oscillating elements 91 may be measured on the basis of the vibration constituent current by the control device 310, thereby deciding whether or not the joining is good. The semiconductor component manufacturing apparatus 301 has the control device 310 in place of the control device 110 in the semiconductor component manufacturing apparatus 101 and additionally includes the vibration constituent current separator 311. The constitution in other points are not different from that of the semiconductor component manufacturing apparatus 101.

The vibration constituent current separator 311 is constituted as shown by an equivalent circuit of FIG. 12, having a vibration constituent current separate part of a capacitor part 312 and a loss constituent current separate part. The loss constituent corresponds to a heat constituent constructed by a coil part 313, a capacitor part 314 and a resistor part 315. The vibration constituent current separator 311 sends only the vibration constituent current separated by the vibration constituent current separate part to the control device 310. In this embodiment, the capacitor 312 is set to 1.22712 nF, the coil 313 is set to 20.9407 mH, the capacitor 314 is set to 295.144 pF and the resistor 315 is set to 10.6797Ω. Since the operation and arrangement for separating the vibration constituent current and loss constituent current are already known, here will be saved the detailed description.

As described above, the manufacturing apparatus has the vibration constituent current separator 311 and control device 310, wherein only the vibration constituent current of the oscillating elements 91 is directly detected without passing through the oscillator 133 in contrast to the first embodiment. Whether or not the joining is good is determined on the basis of the vibration constituent current. Accordingly, the joining can be determined with a higher accuracy than in the first embodiment.

The other operations of the semiconductor component manufacturing apparatus 301 are similar to those in the semiconductor component manufacturing apparatus 101, the description of which is omitted.

Third Embodiment

In the first embodiment, the vibration damping of the semiconductor chip 150 subsequent to the proceed of the joining between the bumps 12 and electrode parts 21 is detected from the change in impedance value of the piezoelectric elements 91. The joining is determined on the basis of the change in impedance value by the control device 110. A method for measuring the vibration damping is not limited to this way.

Figure 13:
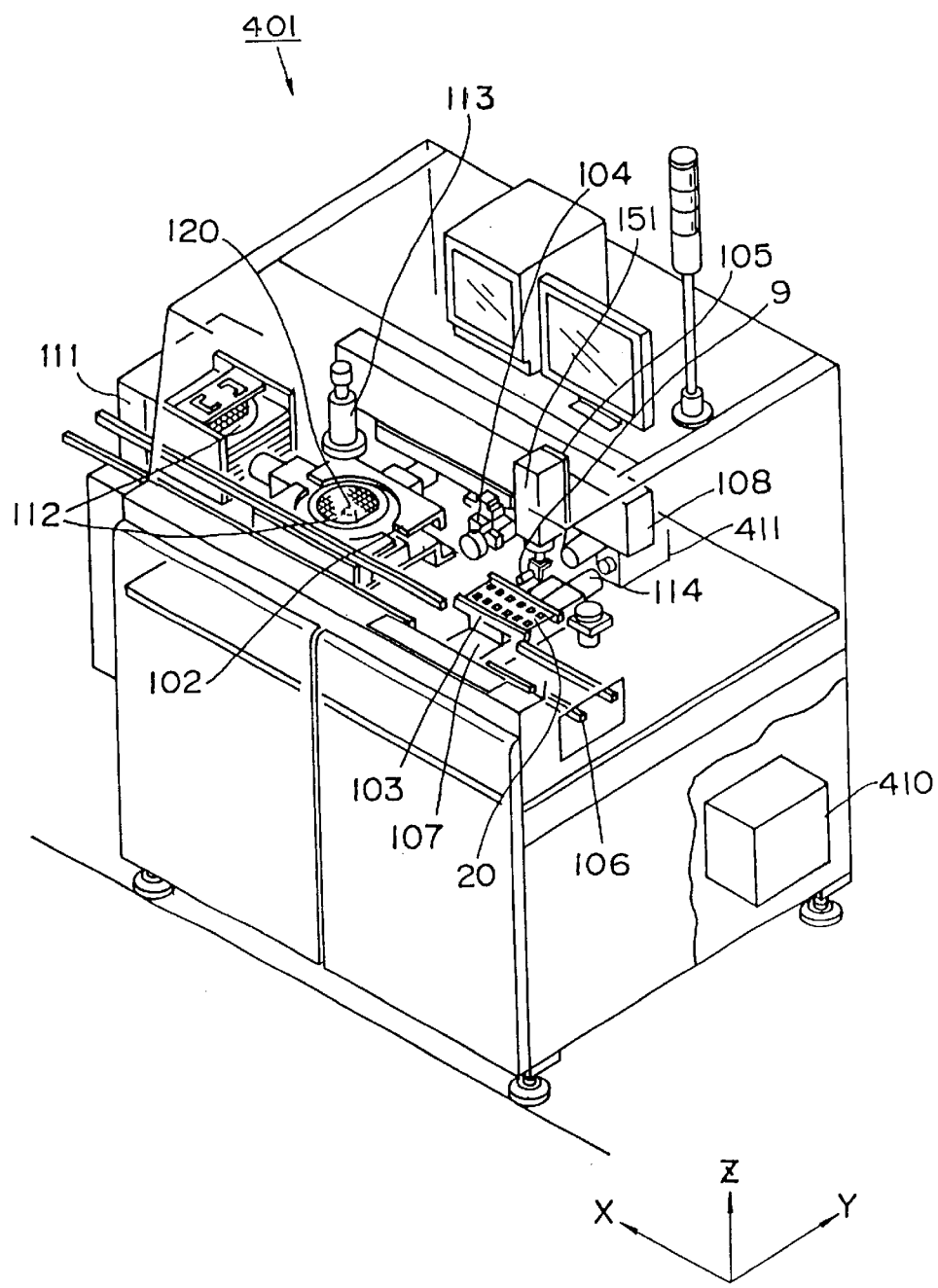
FIG. 13 is a perspective view of a semiconductor component manufacturing apparatus according to a third embodiment of the apparatus in FIG. 1.

For example, in FIG. 13, a semiconductor component manufacturing apparatus 401 is provided with a width measuring device 411 and a control device 410, in which the vibration at the semiconductor chip 150 is directly measured by the width measuring device 411, whereby the joining can be determined on the basis of measured information by the control device 410. The semiconductor component manufacturing apparatus 401 has the control device 410 in place of the control device 110 of the semiconductor component manufacturing apparatus 101 and also the width measuring device 411. The semiconductor component manufacturing apparatus 401 is constituted in other points similarly to the semiconductor component manufacturing apparatus 101.

Figure 14:
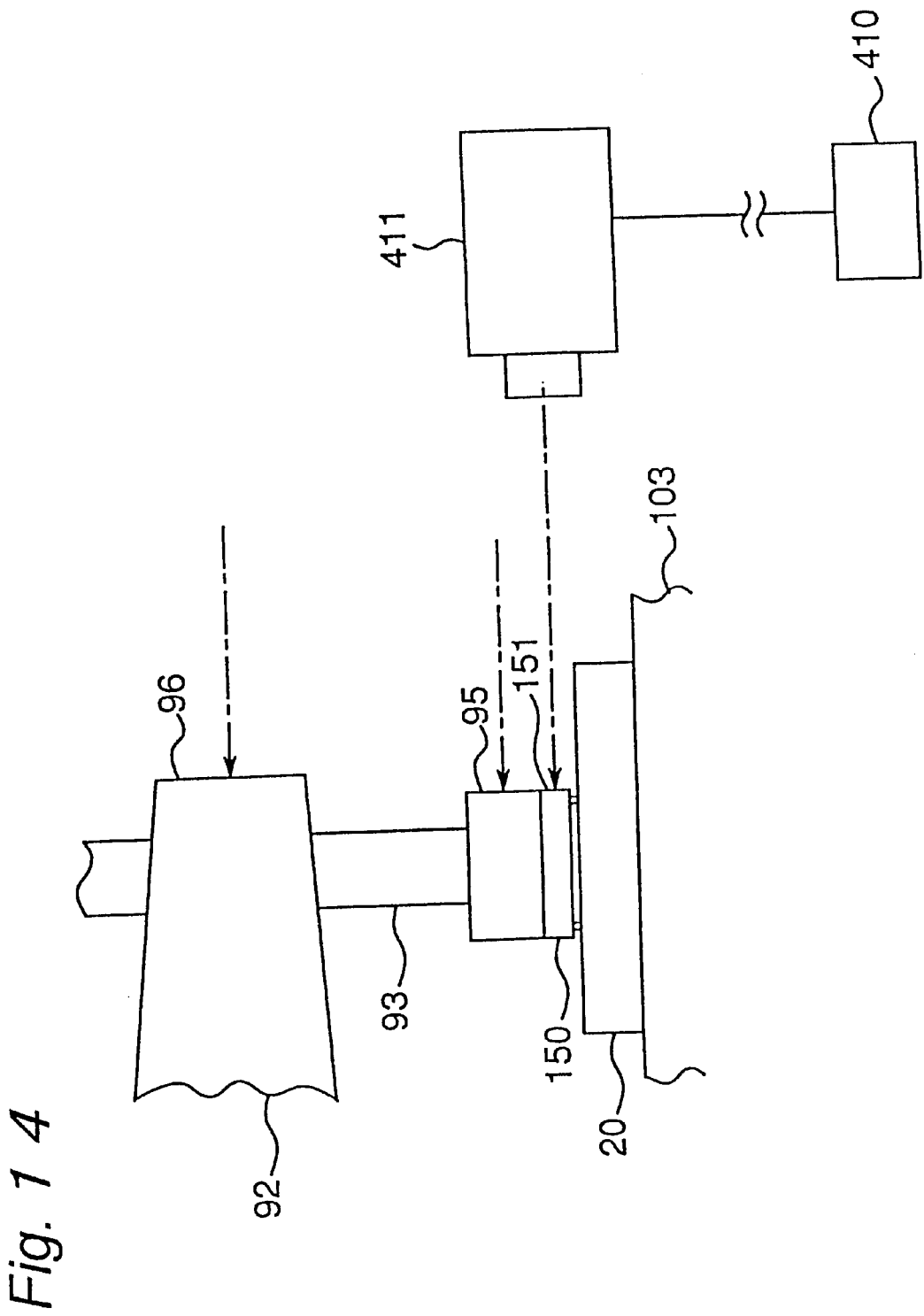
FIG. 14 is a diagram showing an arrangement relationship of a width measuring device and a semiconductor chip in FIG. 13.
Figure 15:
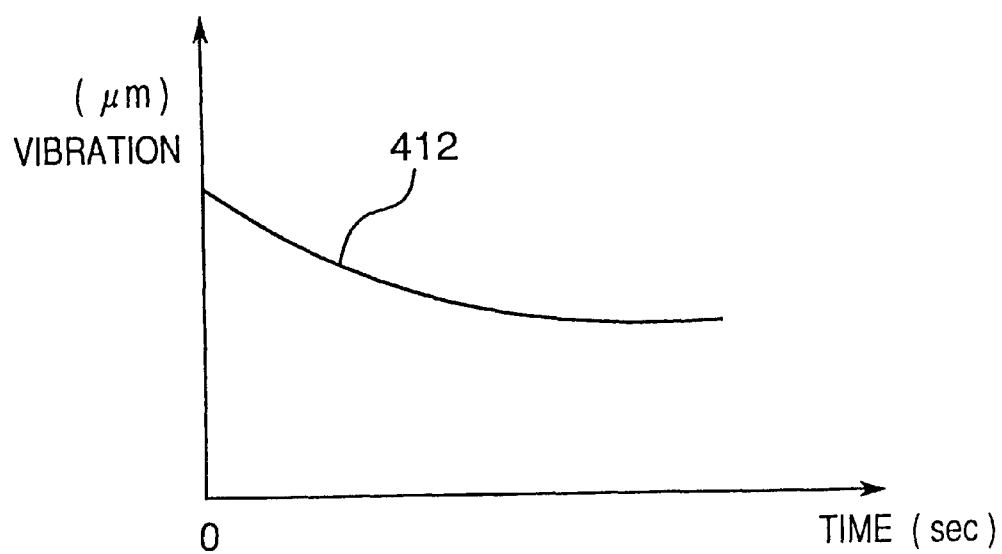
FIG. 15 is a graph of damping of vibration of the semiconductor chip measured by the width measuring device of FIG. 13.

According to the third embodiment, as shown in FIG. 14, the width measuring device 411 irradiates a laser light at a right angle to a vibration measurement face 151 of the semiconductor chip 150 and receives the reflected laser light, thereby directly measuring the vibration damping of the semiconductor chip 150. The width measuring device 411 is arranged so that an optical axis of the laser light is equal in direction to a layer direction of the piezoelectric elements 91, i.e., in parallel to the Y-direction in the embodiment. The vibration damping measured by the width measuring device 411 changes as indicated by a graph 412 of FIG. 15.

The control device 410 makes judgment as follows on the basis of the information supplied from the width measuring device 411 on vibration damping changing as indicated by the graph 412, similar to the deciding device 141 of the control device 110.

More specifically, when every condition of that the vibration of the semiconductor chip 150 decreases in accordance with the lapse of time after the start of the ultrasonic vibration acting to the bumps 12, that the vibration value reaches the balanced value at a time point when the necessary join time has passed after the vibration start, and that the balanced value is maintained in the stable time after the necessary join time has passed is satisfied, the control device 410 determines that the joining is good.

The laser light is irradiated to the semiconductor chip 150 as discussed above according to the embodiment. Although it is most preferable to measure the vibration of the semiconductor chip 150 with the bumps 12, if it is difficult to irradiate the laser light at the right angle to the vibration measurement face 151 because the semiconductor chip 150 in the embodiment is 0.35 mm thick, the laser light may be irradiated at the right angle to a side face 95 of the semiconductor chip hold part at the nozzle 93 or a side face 96 of the ultrasonic horn 92 as shown in FIG. 14.

The bump joining determination apparatus in the third embodiment alike can determine the good/not-good of joining during the execution of the joining.

The operation of the semiconductor component manufacturing apparatus 401 in other points is the same as that of the semiconductor component manufacturing apparatus 101, and the description thereof will be omitted.

Fourth Embodiments

Figure 17:
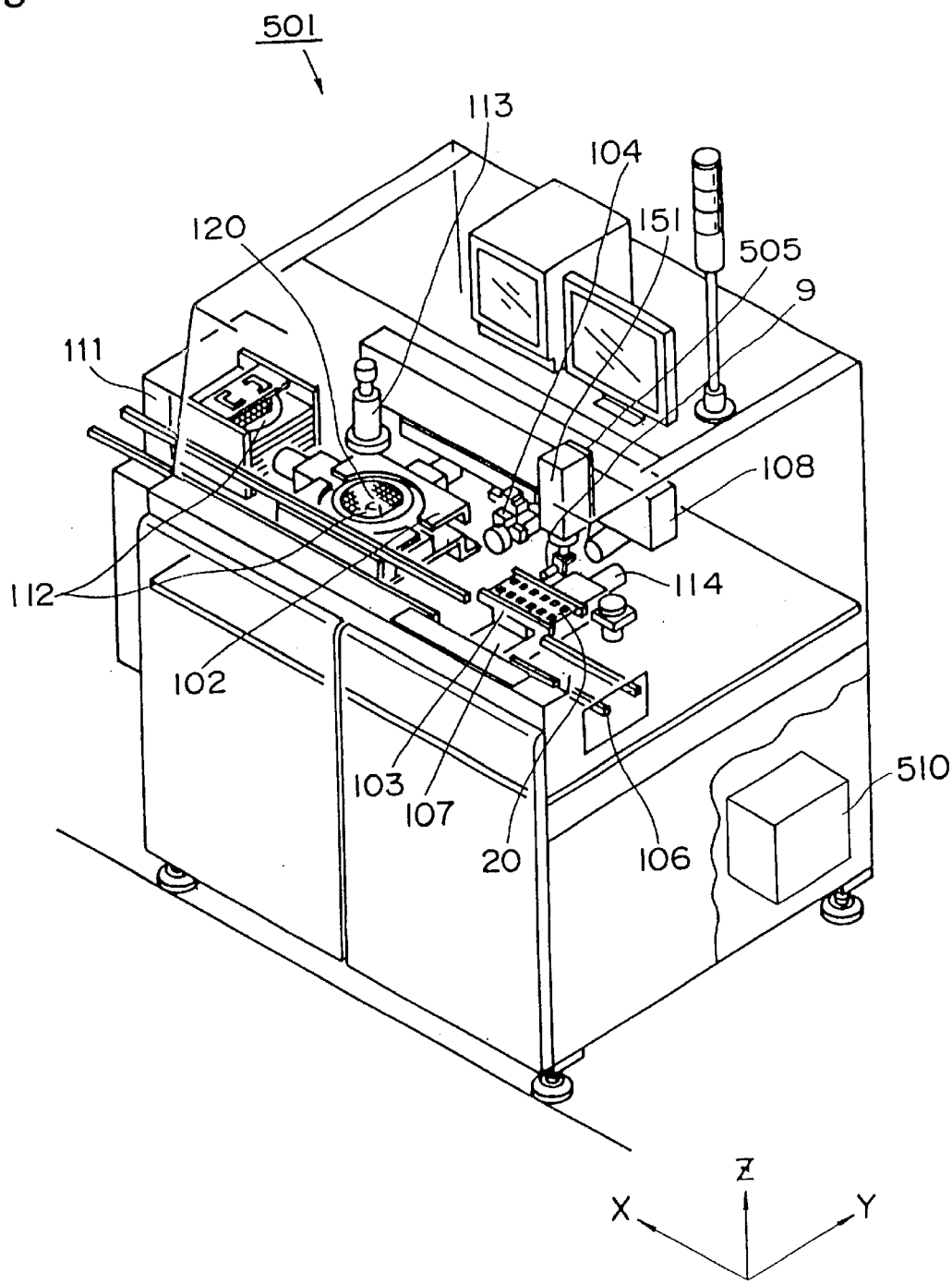
FIG. 17 is a perspective view of a semiconductor component manufacturing apparatus according to a fourth embodiment of the apparatus in FIG. 1.

The fourth embodiment is a modified example of the semiconductor component manufacturing apparatus 101 of the earlier described first embodiment. FIG. 17 shows the constitution of a semiconductor component manufacturing apparatus 501 according to the fourth embodiment. The semiconductor component manufacturing apparatus 501 is similar in constitution to the semiconductor component manufacturing apparatus 101, having a control device 510 instead of the control device 110 of the semiconductor component manufacturing apparatus 101 and a bump join apparatus 505 in place of the bump join apparatus 105. The constitution in other points in the semiconductor component manufacturing apparatus 501 is not different from that of the semiconductor component manufacturing apparatus 101, and therefore the bump join apparatus 505 and the control device 510 will be discussed below with the description for the other constitution points being omitted.

Figure 18:
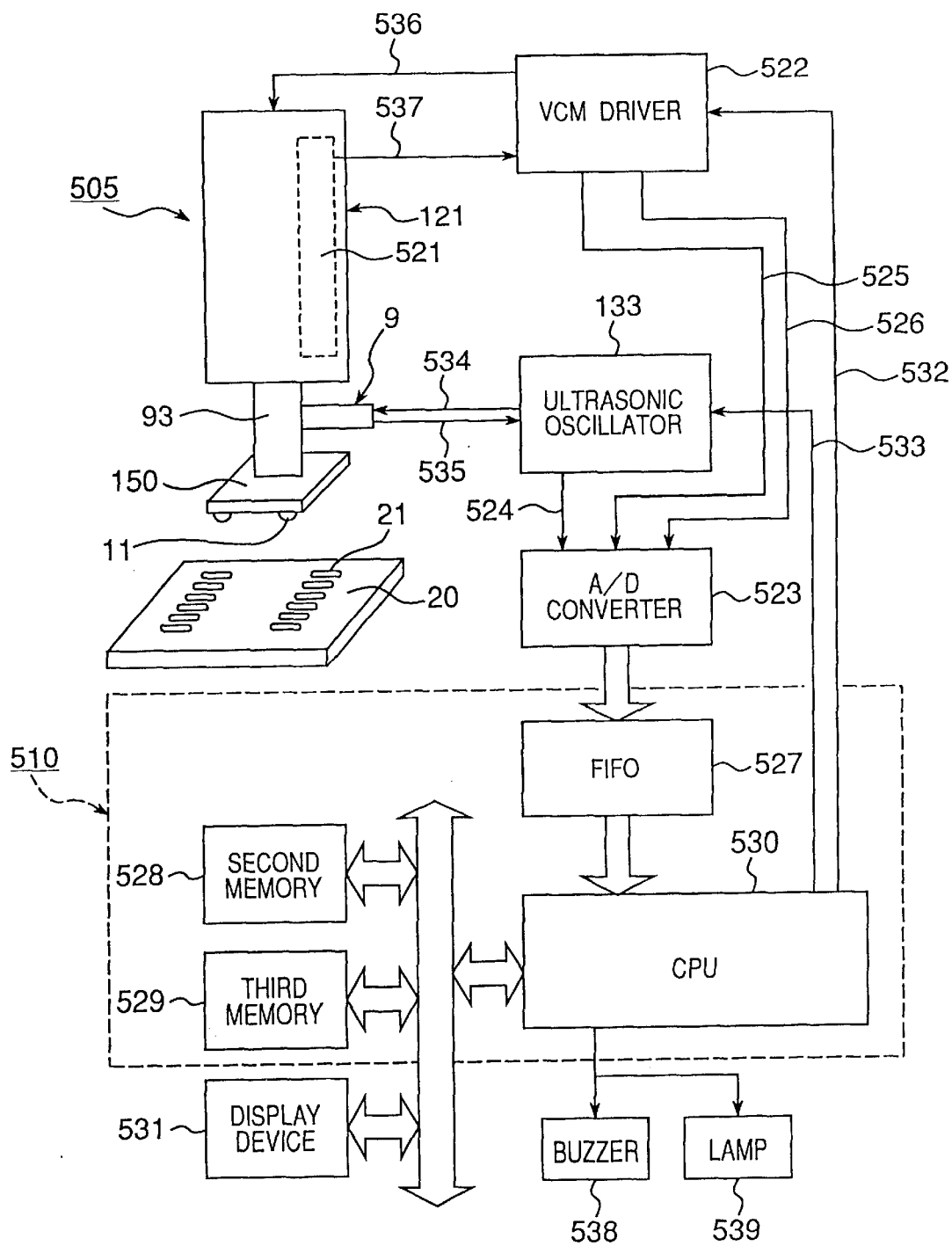
FIG. 18 is a block diagram showing the constitution of the bump join apparatus part and the control device part in the semiconductor component manufacturing apparatus of FIG. 17.

An arrangement for controlling the bump join apparatus 505 and the control device 510 is shown in FIG. 18. In FIG. 18, 121 is the voice coil motor (referred to the "VCM" in some cases hereinafter) and 93 is an example functioning as the component hold member, that is, nozzle for sucking the semiconductor chip 150. 9 is the ultrasonic vibration generating device having the piezoelectric elements 91 as described earlier. When the semiconductor chip 150 is placed on the circuit board 20, the ultrasonic vibration generating device generates ultrasonic vibration in response to an instruction from the ultrasonic oscillator 133 which is an example executing the function of an impedance output device, so that the circuit board 20 and semiconductor chip 150 are joined. 521 is a linear sensor set inside the VCM 121 which is one example executing the function of a measuring device for measuring a present position of the nozzle 93 in an up-down movement. 522 is a driving device for the VCM 121 as an example executing the function of a nozzle pressure control device. A position information 537 of the nozzle 93 is supplied to the VCM driving device 522 from the linear sensor 521, then the VCM driving device 522 feedback controls a position and a speed of the nozzle 93 and a current to be supplied to the VCM 121. Through the feedback control on current, the semiconductor chip 150 is controlled to be pressed onto the circuit board 20 via the bumps 11. 133 is the ultrasonic oscillator sending the impedance at the ultrasonic vibration generating device 9 during the joining of the semiconductor chip 150 and the circuit board 20 via the bumps 11. 523 is an A/D converter which converts, in the embodiment, each analog signal of an impedance signal 524 sent from the ultrasonic oscillator 133, a current signal 525 from the VCM driving device 522 and a present position signal 526 from the VCM driving device 522 to a digital signal. The current signal 525 represents information related to a pressing force of the semiconductor chip 150 to the circuit board 20 via the bumps 11. In the present embodiment, as will be discussed later, whether or not the joining between the semiconductor chip 150 and circuit board 20 is good is determined on the basis of the impedance, pressing force based on the current signal and a displacement amount based on the position signal. Although the A/D converter 523 performs the conversion for the above three pieces of information, it is enough for the A/D converter 523 to convert at least the impedance signal 524 because the joining can be determined on the basis of the impedance alone. 527 is a first-in first-out memory (denoted as "FIFO" hereinafter) as an example executing the function of a first memory device. The FIFO temporarily stores digital signals of the impedance signal 524, current signal 525 and present position signal 526 sequentially converted by the A/D converter 523. 528 is a second memory as an example executing the function of a second memory device for storing digitized waveform data of the impedance signal 524, current signal 525 and present position signal 526 in the case of good joining when the semiconductor chip 150 and circuit board 20 are joined well via the bumps 11. The second memory 528 stores good product waveform data for every kind of the semiconductor chips 150 and circuit boards 20, so that the good product waveform data corresponding to the semiconductor chip 150 and circuit board 20 being used at present can be read out. 529 is a third memory as an example executing the function of a third memory device for storing digitized waveform data of the impedance signal 524, current signal 525 and present position signal 526 in the case where the semiconductor chip 150 and circuit board 20 are joined defectively via the bumps 11. In the embodiment, while the third memory 529 stores the waveform data of the above three, it is enough for the third memory to store the digitized impedance signal 524 at least. 530 is a central processing unit (referred to "CPU" below) for controlling operations of the VCM driving device 522, ultrasonic oscillator 133 and the like thereby controlling the bump joining, which corresponds to an example executing the function of the joining determination apparatus. The joining determination operation will be detailed in an explanatory description for operation below. The above-described FIFO 527, second memory 528, third memory 529 and CPU 530 are included in the control device 510 according to the present embodiment.

531 is a display device.

The operation carried out by the bump join apparatus 505 and control device 510 constituted as above, particularly, the joining determination operation will be depicted with reference to FIGS. 18–25.

The nozzle 93 sucking the semiconductor chip 150 is moved down by the VCM 121 to an upper face of the circuit board 20. Immediately before the semiconductor chip 150 touches the circuit board 20, namely, at a time point when the bumps 11 touch the electrode parts 21 of the circuit board 20, the VCM driving device 522 is switched from a position control method to a current control method in accordance with a command signal 532 from the CPU 530, thus controlling a predetermined set pressure by sending a constant current 536 to a coil of the VCM 121. At the same time, the CPU 530 sends out an ultrasonic oscillation signal 533 to the ultrasonic oscillator 133 to start to join the bumps 11 formed on the electrodes 13 of the semiconductor chip 150 with the electrode parts 21 of the circuit board 20. In other words, the ultrasonic oscillator 133, upon receipt of the ultrasonic oscillation signal 533, applies a sinusoidal voltage 534 of 60–70 kHz to the ultrasonic vibration generating device 9, thereby vibrating the semiconductor chip 150 sucked to a leading end of the nozzle 93. The ultrasonic oscillator 133 obtains the impedance on the basis of a current 535 fed back from the ultrasonic vibration generating device 9 during the oscillation and the sinusoidal voltage 534, and outputs as the ultrasonic impedance signal 524 to the A/D converter 523.

During the joining, the A/D converter 523 converts the impedance signal 524, current signal 525, and present position signal 526 to digital signals. These three converted digital signals are sequentially stored in the FIFO 527 and supplied from the FIFO 527 to the CPU 530. The CPU 530 can thus obtain each of waveform information shown in FIGS. 19–21. Although FIGS. 19–21 indicate each waveform information from a start to an end of the joining, the CPU 530 obtains each waveform information in real time during the proceeding of the joining from the start of the joining.

Figure 19:
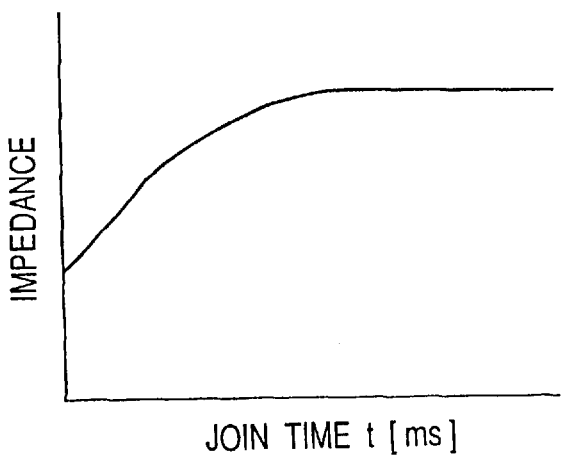
FIG. 19 is a graph of a waveform of an ultrasonic impedance of good joining carried out by the bump join apparatus of FIG. 18.
Figure 20:
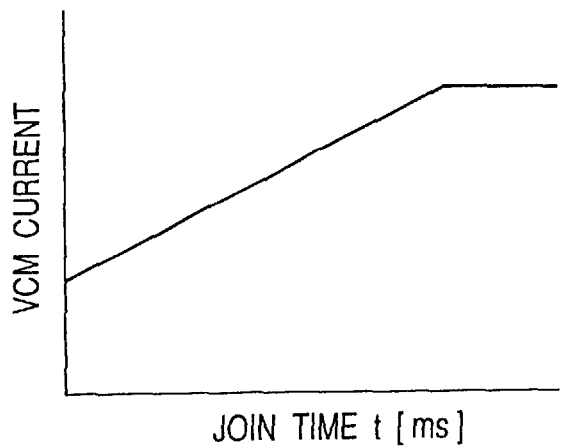
FIG. 20 is a graph of a waveform of a current running to a coil in a VCM at the good joining carried out by the bump join apparatus of FIG. 18.
Figure 21:
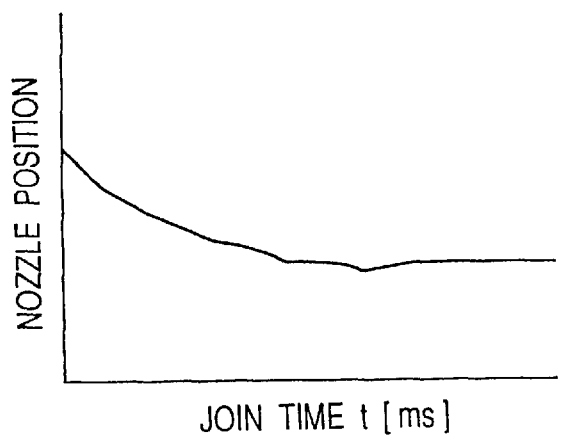
FIG. 21 is a graph of a quantity of a down motion of a nozzle at the good joining carried out by the bump join apparatus of FIG. 18.

FIG. 19 shows waveform data indicative of a relationship of a lapse of time and the ultrasonic impedance from the start to the end of the joining in the case of good joining. As is understood from the waveform data, when the bumps 11 of the semiconductor chip 150 come to touch the circuit board 20 and the ultrasonic vibration is applied, first, a load at the ultrasonic vibration generating device 9 is small and the impedance is small because of the absence of the joining between the bumps 11 of the semiconductor chip 150 and the electrode parts 21 of the circuit board 20. Meanwhile, the load increases and the impedance becomes larger in accordance with the progress of the joining. A fixed time later, the impedance stops changing. FIG. 20 indicates the waveform data of a relationship between the lapse of time and current flowing to the coil of the VCM 121 from the start to the end of the joining when the joining is good. As is clear from the waveform data, the CPU 530 sends to the VCM driving device 522 a command that the current flowing to the coil of the VCM 121 is small at the start of the joining and gradually increases. FIG. 21 is the waveform data of a relationship between the lapse of time and an amount of the down motion of the nozzle 93 from the start of the joining to the end in the case of good joining. As is made clear from the waveform data, the amount of the down motion of the nozzle 93 decreases gradually during the joining and becomes constant because the amount does not decrease any more after the joining is completed.

Figure 22:
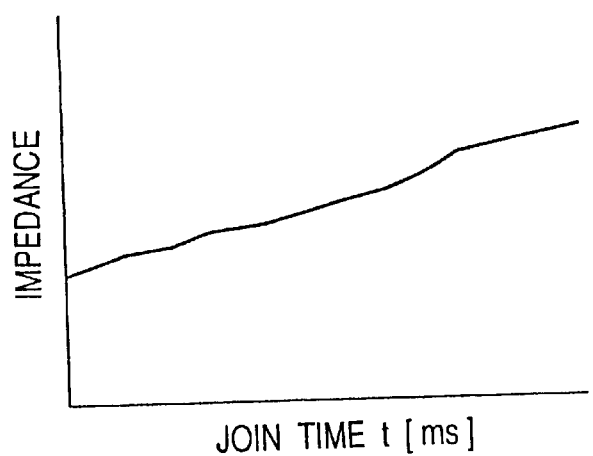
FIG. 22 is a graph of a waveform of the ultrasonic impedance at the defective joining carried out by the bump join apparatus of FIG. 18.
Figure 23:
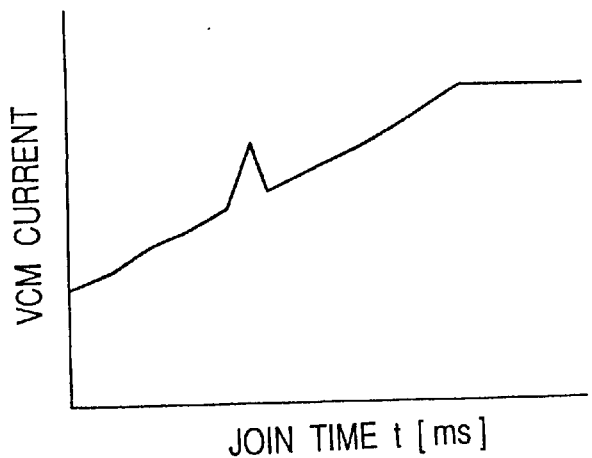
FIG. 23 is a graph of a waveform of the current running to the coil of the VCM at the defective joining carried out by the bump join apparatus of FIG. 18.
Figure 24:
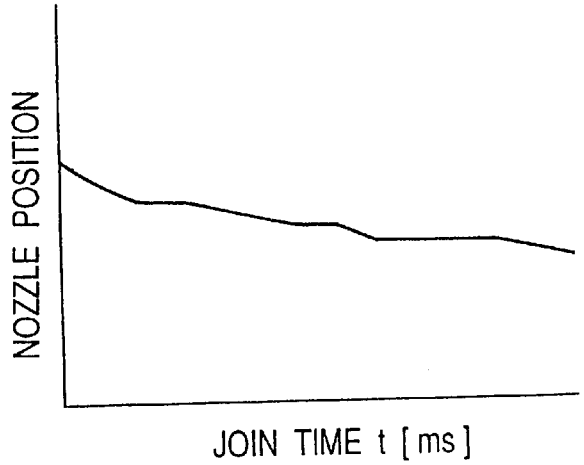
FIG. 24 is a graph of a quantity of the down motion of the nozzle at the defective joining carried out by the bump join apparatus of FIG. 18.

On the other hand, FIGS. 22–24 show each waveform data indicating relationships between the lapse of time and ultrasonic impedance, between the lapse of time and current flowing to the coil of the VCM 121, and between the lapse of time and amount of the down motion of the nozzle 93 from the start to the end of the joining respectively in the case of defective joining. In the waveform of the ultrasonic wave impedance shown in FIG. 22, since the bumps 11 of the semiconductor chip 150 are not joined to the electrode parts 21 of the circuit board 20 in the first place, the load at the ultrasonic vibration generating device 9 is small and the impedance is also small. In the case of defective joining, the impedance increases only by a little in the lapse of time and keeps changing even after the fixed time has passed in comparison with the case of good joining shown in FIG. 19. Thus the defective joining can be determined. In the waveform of the current sent to the coil of the VCM 121 shown in FIG. 23, an abrupt waveform is sometimes observed in response to the command in the case of defective joining in comparison with good joining of FIG. 20. The abrupt waveform indicates a possibility that the bumps 11 of the semiconductor chip 150 are crushed by some reason. As a result, the above joining is determined as a failure. Further, according to the waveform of the amount of the down motion of the nozzle 93 in FIG. 24, although the nozzle gradually moves down during the joining, the amount of the down motion is smaller than a set amount even when the joining is completed. This case can also be regarded as defective joining.

As described hereinabove, the good or defective joining is determined on the basis of the above three kinds of waveform data in the present embodiment. However, the good or defective joining is most surely detected on the basis of the impedance change. So, the judgment of good or defective joining may be based at least on deciding the impedance change.

Figure 25:
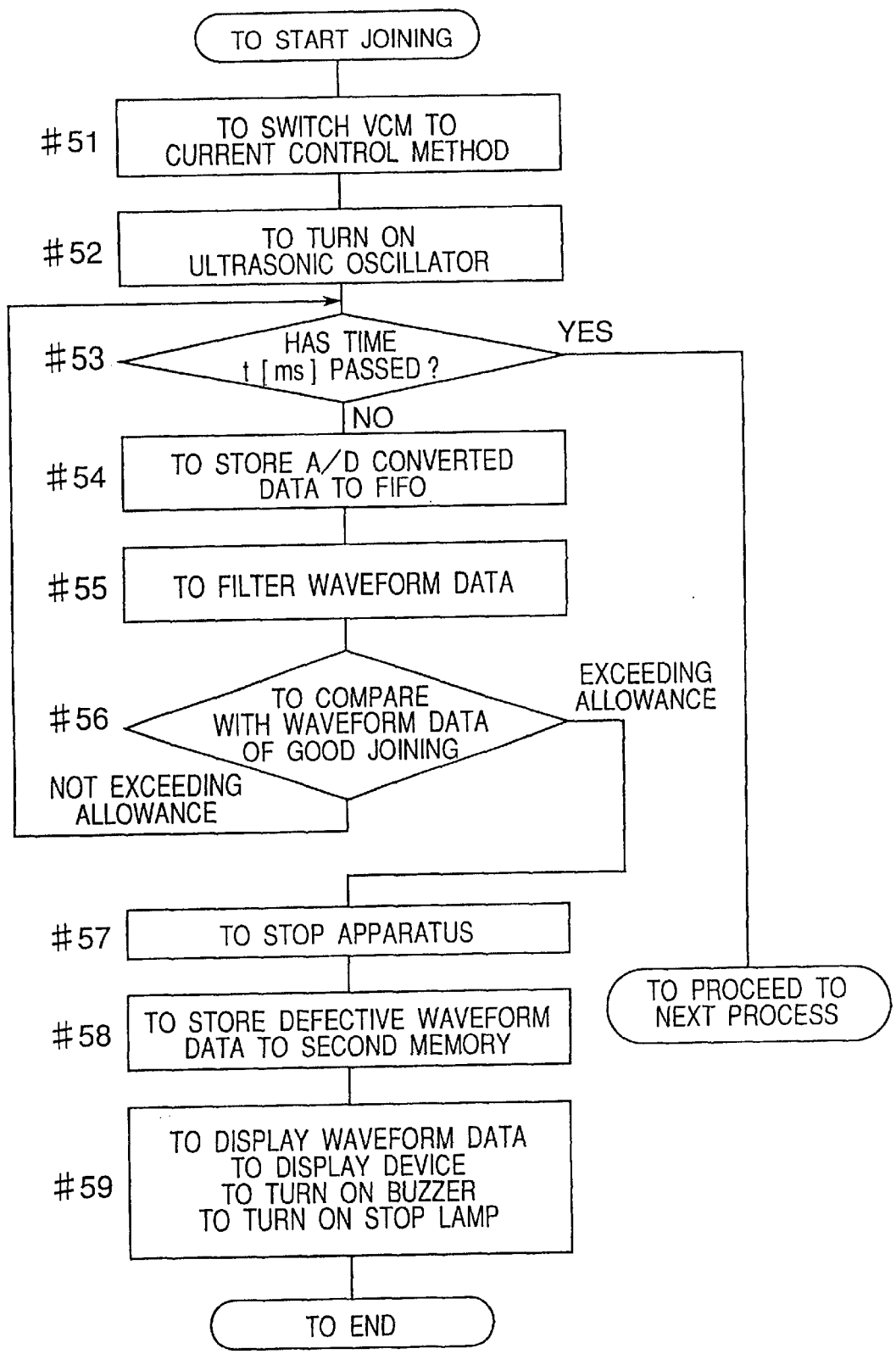
FIG. 25 is a flow chart of a joining determination operation when the joining is executed by the semiconductor component manufacturing apparatus of FIG. 17.

With reference to a flow chart shown in FIG. 25, the joining determination operation of the bump join apparatus 505 and control device 510 during the joining will be described now.

Upon start of the joining, the CPU 530 switches a control method for the VCM 121 from a position feedback control to a current feedback control in step #51, turns on the ultrasonic oscillator 133 to drive the ultrasonic vibration generating device 9 in step #52 and then to generate the ultrasonic vibration. The following steps #54–#56 are carried out while a time t [ms] preliminarily set as a join time elapses, the join time has passed or not is determined in step #53.

If the join time has not passed, in step #54, the digitally converted signals of the impedance signal 524, current signal 525 and present position signal 526 at a sampling time during the joining operation which are sent out from the A/D converter 523 as described before are fed to the FIFO 527. In step #55, filtering is conducted to remove noise constituents in each waveform data stored in the FIFO 527. In step #56, the CPU 530 compares the waveform data of good joining shown in FIGS. 19–21 which are preliminarily stored in the second memory 528 with the filtered three waveform data supplied from the FIFO 527 from the start time of the joining to the sampling time. According to the present embodiment, all of the three waveform data are used in the comparing operation. Since the second memory 528 stores three waveform data of the impedance, current and motion amount of the nozzle for each kind of the semiconductor chips 150 and circuit boards 20, the CPU 530 reads out three waveform data corresponding to the semiconductor chip 150 and circuit board 20 being used at present. When all of absolute values of each of differences for the three waveform data exceed preliminarily set respective allowances, the CPU 530 determines that the joining is defective, and proceeds to step #57, where the bump join apparatus 505 is stopped. On the other hand, when any one of the absolute values of the differences for the three waveform data is not larger than the allowance, the step #53 is executed. When the join time t[ms] has not passed, the CPU 530 samples again to determine the joining and then executing steps #54–#56. When the join time t[ms] has passed, a next process is executed.

The following arrangement may be employed in place of comparing all three waveform data and deciding as the joining failure when all of the three waveform data exceed the allowances as in the present embodiment. That is, it can be determined as defective joining when any one of the three data exceeds the allowance, while it is determined as good joining only when all of the three data are not larger than the allowances. Alternatively, the judgment may be carried out for only one of the three waveform data. At this time, the judgment is preferably based on the impedance signal because the impedance signal is more surely indicative of whether the joining is good or not as described above. Or, the judgment is carried out on the basis of the impedance signal and present position signal or on the basis of the impedance signal and current signal, whereby it can be determined as the joining failure when at least one of the two signals indicates the failure. Otherwise, the good/defective joining judgment is made sequentially for the three waveform data and the joining can be determined as a failure at a time point when the failure is detected. In this case, the determination is preferably performed first on the impedance signal.

In step #58, the CPU 530 stores three waveform data in the case of defective joining into the third memory 529 according to the embodiment and then displays the waveform data of defective joining to the display device 531 in step #59. Simultaneously, the CPU 530 turns a buzzer 538 on and illuminates a stop lamp 539 to inform a worker of the occurrence of the joining failure.

Through the above-described operation, for example, the impedance at the ultrasonic vibration generating device, the current supplied to the VCM 121, and the amount of the down motion of the nozzle 93 are measured during the joining between the bumps 11 formed on the electrodes 13 of the semiconductor chip 150 and the electrode parts 21 of the circuit board 20, and each waveform data is compared with the waveform data of good joining. According to the above operation, defective products are eliminated and only good products are sent further to a next process. A join quality can be accordingly improved.

As a modification of the above-described operation, a joining determination operation in FIGS. 26–29 may be carried out. In FIGS. 26–29, the same operations as in FIG. 25 are designated by the same step numbers, and the description thereof will be omitted.

In the operation shown in FIGS. 26–29, when the joining failure is detected during the joining between the bumps 11 formed on the electrodes 13 of the semiconductor chip 150 and the electrode parts 21 of the circuit board 20, the join condition is changed to achieve good joining, and moreover, the joining determination is executed on the basis of the number n of times of changing the join condition in addition to the judgment within the join time t[ms] described above. The operation will be detailed.

Figure 26:
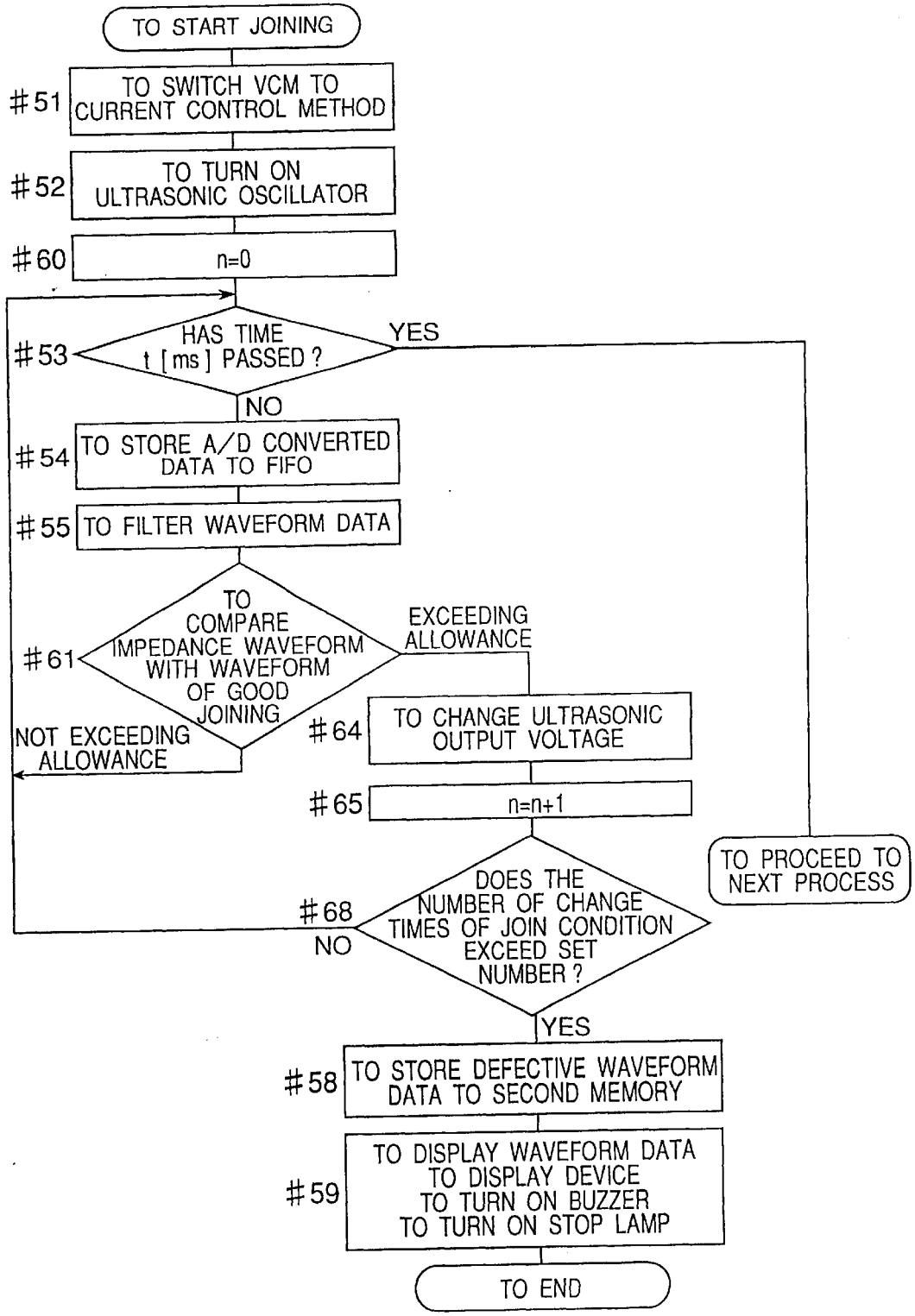
FIG. 26 is a flow chart of a modified example of the joining determination operation in FIG. 25 when the impedance waveform is used as a determination reference.

In FIG. 26, step #60 is executed between the steps #52 and #53, in which an initial value of the number n of change times is reset to zero.

In step #61 next to step #55, during the joining, the CPU 530 compares the filtered impedance waveform data sent from the FIFO 527 with the impedance waveform data of good joining read out from the second memory 528. When the absolute value of the difference of the two data exceeds the allowance, the process goes to step #64. In step #64, the CPU 530 changes the join condition, that is, increases or decreases the ultrasonic output voltage of the ultrasonic oscillator 133 to the ultrasonic vibration generating device 9 so as to change the join state of the bumps 11 and electrode parts 21 to good which is on its way to becoming worse at the sampling time. Since the join condition is changed once in step #64 as mentioned above, 1 is added to the number n of change times of the join condition in step #65. In step #68, it is determined whether or not the number n is larger than a preliminarily set number and the process returns to step #53 unless the number exceeds the preliminarily set number. On the other hand, when the number of change times exceeds the set number, i.e., when the join state is not improved in spite of recovery trials for the set number of times, the recovery is determined to be impossible and the process moves to step #58.

Figure 27:
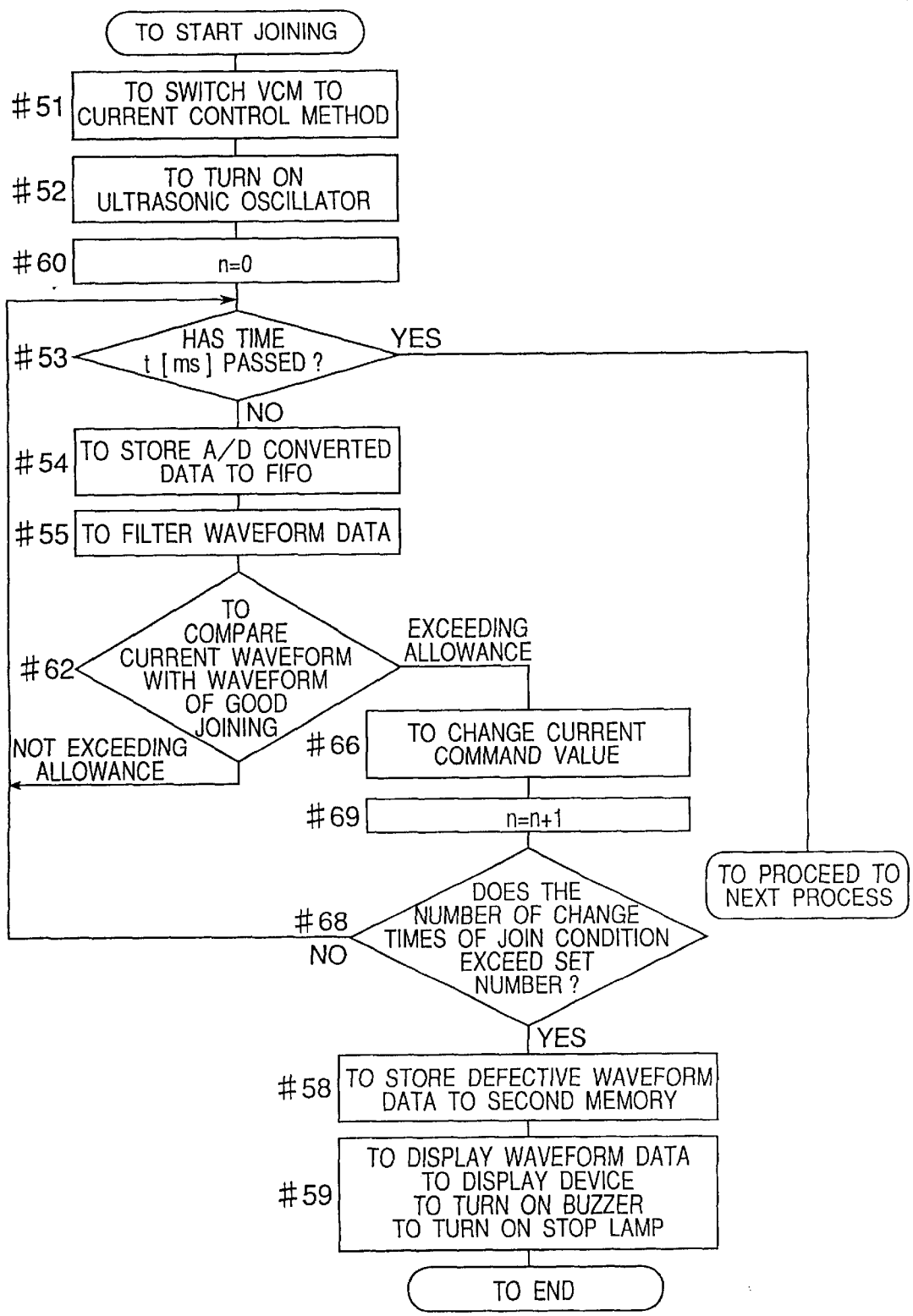
FIG. 27 is a flow chart of a modified example of the joining determination operation in FIG. 25 when the current waveform is used as a determination reference.

Instead of the joining judgment on the basis of the impedance waveform as described above, the joining judgment may be made on the basis of the current waveform data as shown in FIG. 27. Concretely, step #62 is executed next to step #55. In step #62, during the joining, the CPU 530 compares the filtered current waveform data sent from the FIFO 527, namely, data related to the pressing force of the semiconductor 150 to the circuit board 20 with the current waveform data of good joining read out from the second memory 528. When an absolute value of the difference is larger than the preliminarily set allowance, the flow goes to step #66. In step #66, the CPU 530 changes the join condition, that is, increases or decreases the current sent from the VCM driving device 522 to the VCM 121 to change the pressing force, thereby changing the join state between the bumps 11 and the electrode parts 21 to good which is on its way to becoming worse at the sampling time. Now that the join condition is changed once in step #66 as above, 1 is added to the number n of change times in step #69. The step then goes to the step #68.

Figure 28:
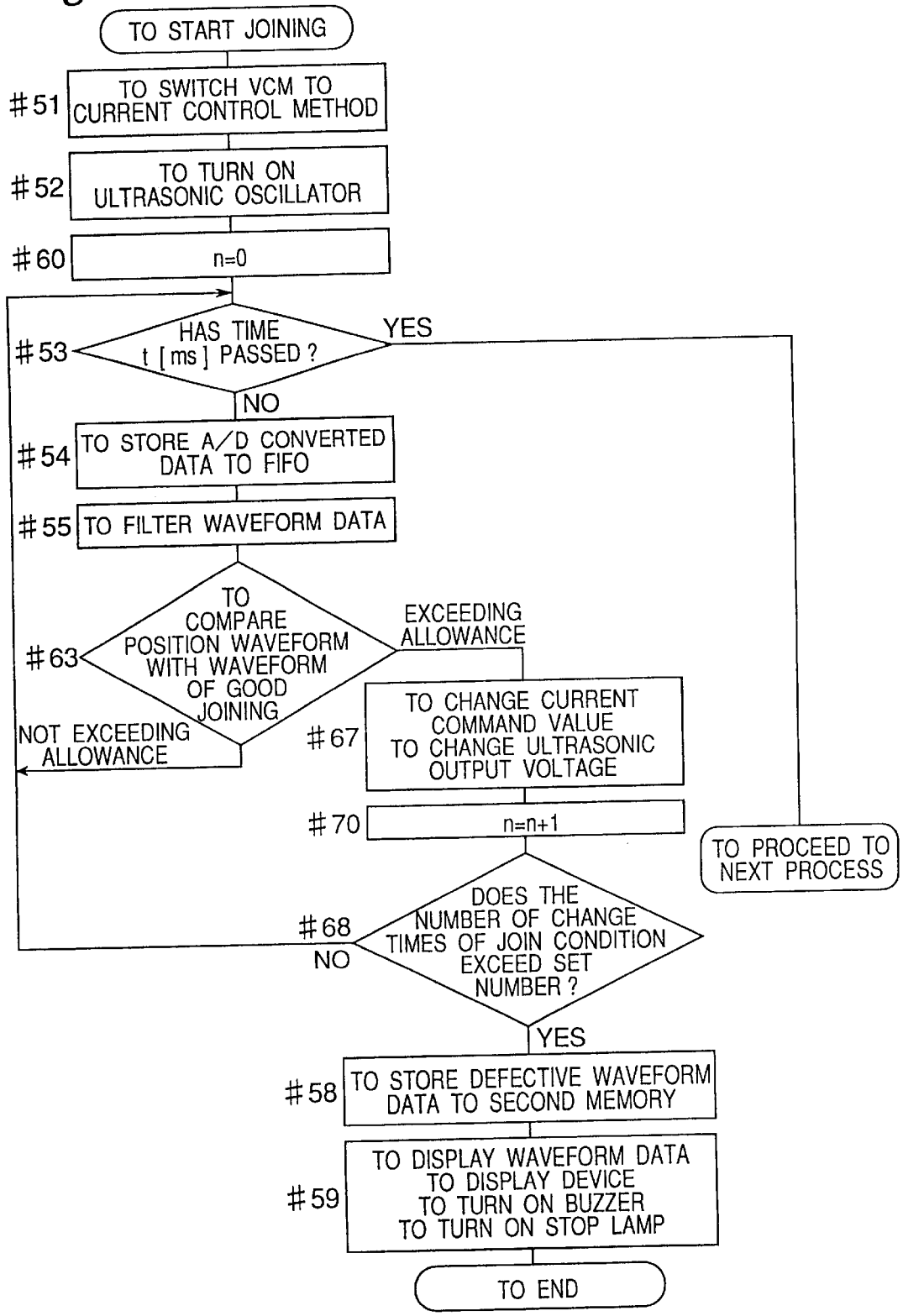
FIG. 28 is a flow chart of a modified example of the joining determination operation in FIG. 25 when the position waveform is used as a determination reference.

Instead of the joining judgment on the basis of the impedance waveform and current waveform as described hereinabove, a joining judgment based on the position waveform data may be carried out, as shown in FIG. 28. Specifically, step #63 is conducted next to step #55. In step #63, the CPU 530 compares the position waveform data which is filtered and sent out of the FIFO 527, that is, data related to the shift amount in the up-down direction of the semiconductor chip 150, i.e., nozzle 93 holding the semiconductor chip 150 with the position waveform data of good joining read out from the second memory 528. In the case where an absolute value of a difference of the two data exceeds the preliminarily set allowance, the process goes to step #67. The CPU 530 changes the join condition in step #67 by increasing or decreasing the current to be fed from the VCM driving device 522 to the VCM 121 to change the pressing force so as to turn the join state between the bumps 11 and electrode parts 21 which is on its way to becoming worse at the sampling time to good. Moreover, the CPU 530 increases or decreases the ultrasonic output voltage of the ultrasonic oscillator 133 to the ultrasonic vibration generating device 9 so as to change the join state. Since the join condition is changed once in step #67, 1 is added to the number n of change times in step #70. The flow goes to the step #68.

Figure 29:
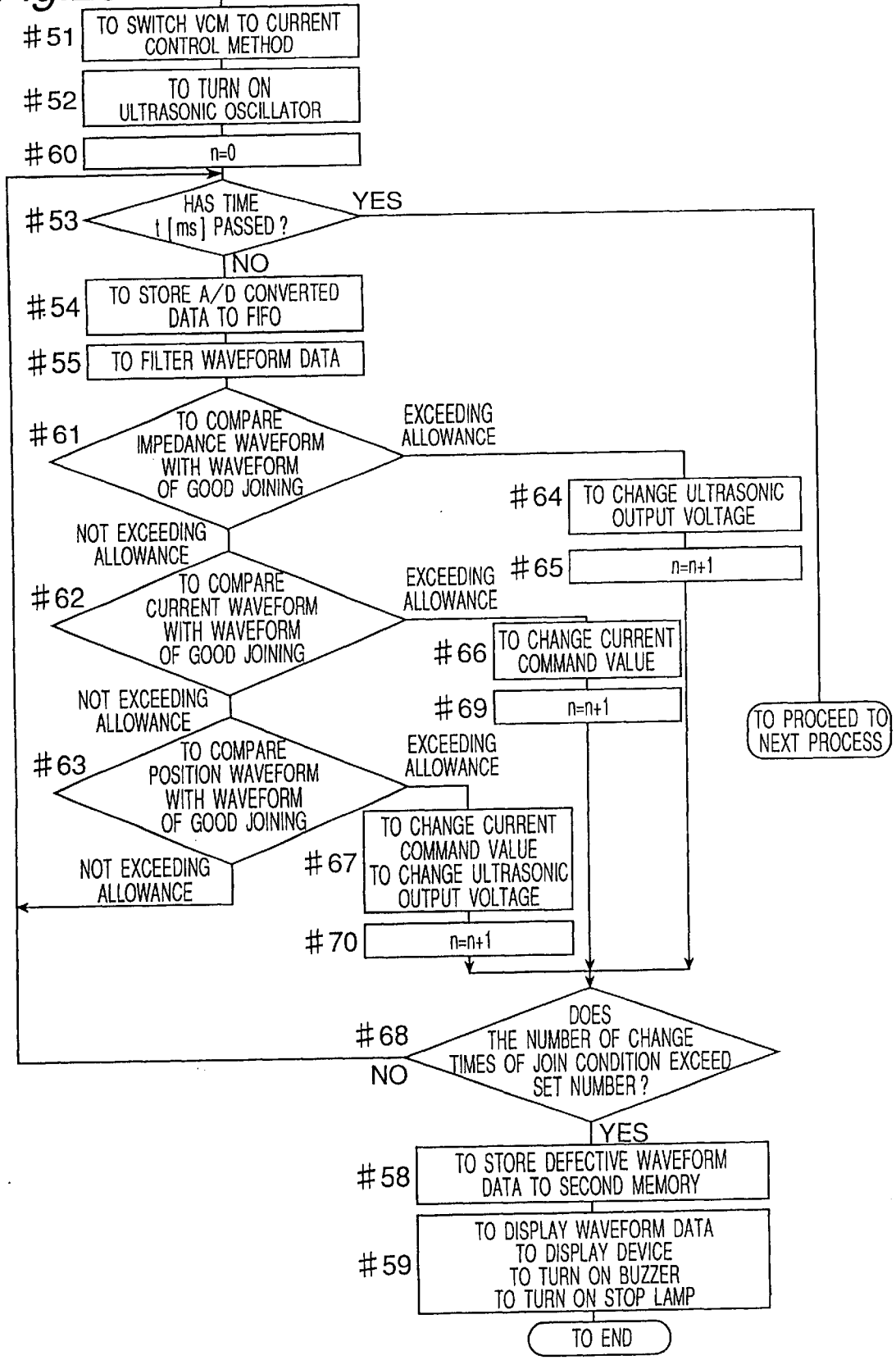
FIG. 29 is a flow chart of a modified example of the joining determination operation in FIG. 25 when the impedance waveform, current waveform and position waveform are used as determination references.
Figure 30:
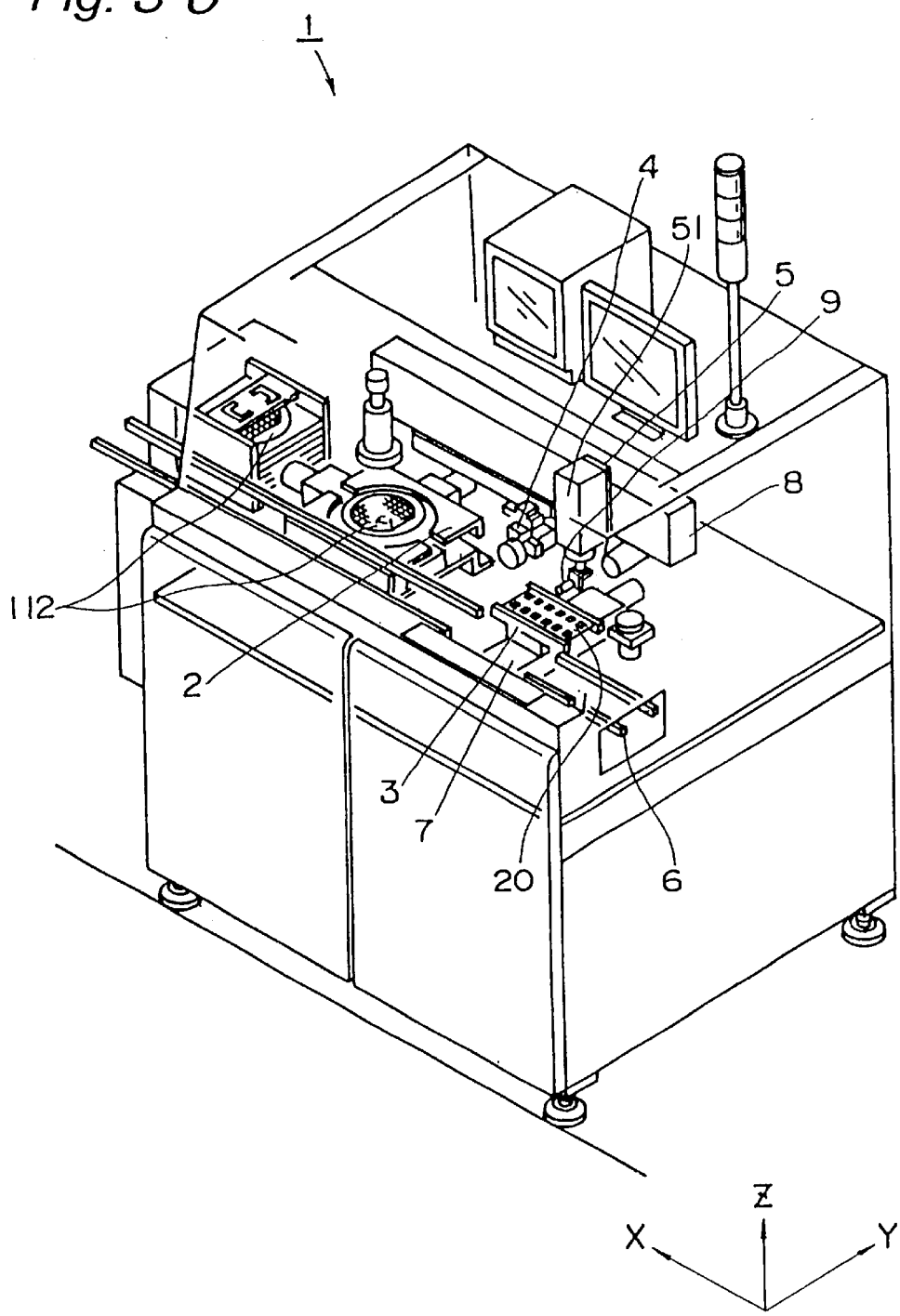
FIG. 30 is a perspective view of an example of a conventional semiconductor component manufacturing apparatus.

Such arrangement as indicated in FIG. 29 may be constructed, in which step #61 is carried out next to step #55, and step #62 is executed when the absolute value of the difference between the impedance waveform data and impedance waveform data of good joining does not exceed the allowance, that is, when it is determined in step #61 that the joining proceeds well from a viewpoint of the impedance waveform, then step #63 is executed when it is determined in step #62 that the joining proceeds well from a viewpoint of the current waveform.

According to the embodiment, the set number of change times in step #68 is an appropriate value of approximately 10 and the join time t[ms] in step #53 is set to be an appropriate value within 200–500 ms.

Through the execution of operations in FIGS. 26–29, the impedance at the ultrasonic vibration generating device 9, the current supplied to the VCM 121 and the amount of the down motion of the nozzle 93 are measured and the waveform data are monitored in real time. Thus, if the join state during the joining becomes worse, the join condition can be changed and then generation of defective products can be prevented and the yield can be improved.

Although the above explanation in the fourth embodiment is done with the form that the semiconductor chip 150 is ultrasonically vibrated, the present invention is not limited to the form so long as the semiconductor chip 150 and circuit board 20 are relatively ultrasonically vibrated as described in the first embodiment. Also, although the above explanation in the fourth embodiment is done with the form that the semiconductor chip 150 is moved to the circuit board 20, the present invention is not restricted to this form and it is enough to relatively move the semiconductor chip 150 and the circuit board 20 as in the first embodiment.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A bump joining determination method for deciding whether bump joining is good or defective at a time when electrodes of an electronic component and electrode parts of a circuit board are joined via bumps with the electronic component and circuit board relatively vibrated, said method comprising:

detecting damping of a vibration of the bumps; and deciding whether the joining is good or defective on a basis of the detected vibration damping.

2. The bump joining determination method according to claim 1, wherein said detecting damping in the vibration is executed by detecting an impedance value increasing in accordance with the vibration damping at a vibration generating device which relatively vibrates the electronic component and circuit board, and wherein said deciding whether the joining is good or defective is determined on the basis of an increase of the impedance value resulting from the vibration damping.

3. The bump joining determination method according to claim 2, wherein the joining is determined as good when the impedance value increases in accordance with a lapse of time after a start time of applying the vibration, reaches a balanced value after a necessary join time has passed since the start time, and maintains the balanced value for a stable time after the necessary join time.

4. A semiconductor component manufacture method for manufacturing a semiconductor component by joining electrodes of an electronic component and electrode parts of a circuit board via bumps with use of ultrasonic vibration, said method comprising:

comparing a change in impedance related to generation of the ultrasonic vibration from a start to an end of joining between the electrodes and electrode parts with a change in impedance of good joining from the start to the end when the joining of the electronic component and circuit board is good; and deciding whether or not the joining is good based on the comparison.

5. The semiconductor component manufacture method according to claim 4, further comprising:

applying the ultrasonic vibration, and moving and pressing the electronic component and circuit board to be close to each other via the bumps in a thickness-direction of the circuit board;

in addition to the comparison of changes in the sent impedance with impedance of good joining, further executing at least one comparison of a change in shift between the electronic component and circuit board from the start to the end with a change in shift of good joining when the joining of the electronic component and circuit board is good from the start to the end, and a change in pressing force between the electronic component and circuit board from the start to the end with a change in pressing force of good joining from the start to the end when the joining of the electronic component and circuit board is good is conducted; and deciding whether or not the joining is good based on the comparison.

6. The semiconductor component manufacture method according to claim 4, wherein the ultrasonic vibration is changed to improve the joining of the electronic component and circuit board when it is decided that the joining is defective during the joining.

7. The semiconductor component manufacture method according to claim 6, wherein the pressing force between the electronic component and circuit board from the start to the end on joining when the electronic component and circuit board are moved in the thickness-direction of the circuit board via the bumps to be close to each other is changed to improve the joining when the joining is not improved simply by changing the ultrasonic vibration.

8. A bump joining determination apparatus for deciding whether bump joining is good or defective at a time when electrodes of an electronic component and electrode parts of a circuit board are joined via bumps with the electronic component and the circuit board relatively vibrated so as to manufacture a semiconductor component, said apparatus comprising:

a vibration damping detect device for detecting damping of a vibration of the bumps; and a deciding device for deciding whether the joining is good or defective on a basis of the vibration damping detected by said vibration damping detect device.

9. The bump joining determination apparatus according to claim 8, wherein said vibration damping detect device detects an impedance value of a vibration generating device increasing in accordance with the vibration damping of the electronic component and the circuit board relatively vibrated; and wherein said deciding device determines whether the joining is good or defective on a basis of an increase of the impedance value resulting from the vibration damping.

10. The bump joining determining apparatus according to claim 9, wherein said deciding device determines that the joining is good when the impedance value increases in accordance with a lapse of time after a start time of applying the vibration, reaches a balanced value after a necessary join time has passed since the start time, and maintains the balanced value for a stable time after the necessary join time.

11. The bump joining determination apparatus according to claim 8, wherein the relative vibration of the electronic component and circuit board is provided by vibrating the electronic component while the circuit board is fixed.

12. The bump joining determination apparatus according to claim 8, wherein said vibration damping detect device has a width measuring device for measuring a vibration width of the vibration with utilization of a laser light, and wherein said deciding device determines whether the joining is good or defective on the basis of damping in vibration width.

13. The bump joining determination apparatus according to claim 12, wherein said width measuring device irradiates the laser light at a right angle to a vibration measurement face and measures the vibration width on the basis of reflecting light when the relative vibration to the electronic component and circuit board is provided by vibrating the electronic component while the circuit board is fixed.

14. The bump joining determination apparatus according to claim 8, wherein said vibration damping detect device has a vibration constituent current separator, connected to a vibration generating device used for relatively vibrating the electronic component and circuit board, for separating a vibration constituent current at said vibration generating device; and wherein said deciding device determines whether the joining is good or defective on the basis of the vibration constituent current output from said vibration constituent current separator.

15. A semiconductor component manufacturing apparatus comprising the bump joining determination apparatus according to claim 8.

16. The bump joining determination apparatus according to claim 9, wherein the relative vibration of the electronic component and circuit board is provided by vibrating the electronic component while the circuit board is fixed.

17. The bump joining determination apparatus according to claim 10, wherein the relative vibration of the electronic component and circuit board is provided by vibrating the electronic component while the circuit board is fixed.

18. A semiconductor component manufacturing apparatus comprising the bump joining determination apparatus according to claim 9.

19. A semiconductor component manufacturing apparatus comprising the bump joining determination apparatus according to claim 10.

20. A semiconductor component manufacturing apparatus comprising the bump joining determination apparatus according to claim 11.

21. A semiconductor component manufacturing apparatus comprising the bump joining determination apparatus according to claim 12.

22. A semiconductor component manufacturing apparatus comprising the bump joining determination apparatus according to claim 13.

23. A semiconductor component manufacturing apparatus comprising the bump joining determination apparatus according to claim 14.

24. A semiconductor component manufacturing apparatus for joining electrodes of an electronic component and electrode parts of a circuit board via bumps with use of ultrasonic vibration so as to manufacture a semiconductor component, said apparatus comprising:

an impedance output device for making a vibration generating device generate the ultrasonic vibration and for sending an impedance related to the vibration generating device during the joining carried out via the bumps; and a joining determination apparatus for comparing changes in the sent impedance with an impedance of good joining when the joining of the electronic component and circuit board is good so as to determine whether the joining is good or defective.

25. The semiconductor component manufacturing apparatus according to claim 24, further comprising:

a pressure control device for making an electronic component hold member hold the electronic component and move the electronic component hold member in a thickness-direction of the circuit board, and for mounting the electronic component onto the circuit board via the bumps while controlling a pressure; and a measuring device for measuring a shift of the electronic component hold member when pressing the electronic component onto the circuit board via the bumps at said pressure control device;

wherein said joining determination apparatus determines whether the joining is good or defective by further comparing changes in the shift of the electronic component hold member sent by said measuring device with a shift of good joining when the joining of the electronic component and circuit board is good.

26. The semiconductor component manufacturing apparatus according to claim 24, further comprising:

a pressure control device which makes an electronic component hold member hold the electronic component and moves the electronic component hold member in a thickness-direction of the circuit board so as to mount the electronic component onto the circuit board via the bumps while controlling a pressure, and which sends a pressing force of the electronic component hold member when pressing the electronic component onto the circuit board via the bumps;

wherein said joining determination apparatus decides whether the joining is good or defective by further comparing changes in the pressing force of the electronic component hold member sent from said pressure control device with a pressing force of good joining when the joining of the electronic component and circuit board is good.

27. The semiconductor component manufacturing apparatus according to claim 25, wherein said pressure control device sends a pressing force of the electronic component hold member when pressing the electronic component onto the circuit board, said joining determination apparatus further deciding whether the joining is good or defective by comparing changes in the pressing force of the electronic component hold member sent from said pressure control device with a pressing force of good joining when the joining of the electronic component and circuit board is good.

28. The semiconductor component manufacturing apparatus according to claim 24, wherein said joining determination apparatus makes said impedance output device change the ultrasonic vibration to improve the joining of the electronic component and circuit board when it is decided that the joining is defective during the joining.

29. The semiconductor component manufacturing apparatus according to claim 27, wherein said joining determination apparatus makes the impedance output device change the ultrasonic vibration to improve the joining of the electronic component and circuit board when it is decided that the joining is defective during the joining, and makes said pressure control device change the pressure to improve the joining if the joining is not improved by changing the ultrasonic vibration.

30. The semiconductor component manufacturing apparatus according to claim 27, further comprising:

a first memory for storing changes in the impedance sent from said impedance output device, shift of the electronic component hold member sent from said measuring device, and a pressing force of the electronic component hold member sent from said pressure control device; and a second memory for storing changes in the impedance of good joining, the shift of good joining, and the pressing force of good joining;

wherein said joining determination apparatus decides whether the joining is good or defective by comparing changes in the sent impedance with the impedance of good joining, shift of the electronic component hold member and shift of good joining, and the pressing force of the electronic component hold member and the pressing force of good joining stored in said first memory and said second memory respectively.

31. The semiconductor component manufacturing apparatus according to claim 24, further comprising:

a display device for displaying judgment results by said joining determination apparatus; and a third memory for storing a change in impedance when said joining determination apparatus determines that the electronic component and circuit board are joined defectively;

wherein said joining determination apparatus makes said display device display the change in impedance when deciding that the electronic component and circuit board are joined defectively, and also makes said third memory store the change in impedance.

32. The semiconductor component manufacturing apparatus according to claim 25, wherein said joining determination apparatus makes said impedance output device change the ultrasonic vibration to improve the joining of the electronic component and circuit board when it is decided that the joining is defective during the joining.

33. The semiconductor component manufacturing apparatus according to claim 26, wherein said joining determination apparatus makes said impedance output device change the ultrasonic vibration to improve the joining of the electronic component and circuit board when it is decided that the joining is defective during the joining.

34. The semiconductor component manufacturing apparatus according to claim 25, further comprising:

a display device for displaying judgement results by said joining determination apparatus; and a third memory for storing a change in impedance when said joining determination apparatus determines that the electronic component and circuit board are joined defectively;

wherein said joining determination apparatus makes said display device display the change in impedance when deciding that the electronic component and circuit board are joined defectively, and also makes said third memory store the change in impedance.

35. The semiconductor component manufacturing apparatus according to claim 26, further comprising:

a display device for displaying judgment results by said joining determination apparatus; and a third memory for storing a change in impedance when said joining determination apparatus determines that the electronic component and circuit board are joined defectively;

wherein said joining determination apparatus makes said display device display the change in impedance when deciding that the electronic component and circuit board are joined defectively, and also makes said third memory store the change in impedance.

36. The semiconductor component manufacturing apparatus according to claim 27; further comprising:

a display device for displaying judgment results by said joining determination apparatus; and a third memory for storing a change in impedance when said joining determination apparatus determines that the electronic component and circuit board are joined defectively;

wherein said joining determination apparatus makes said display device display the change in impedance when deciding that the electronic component and circuit board are joined defectively, and also makes said third memory store the change in impedance.

37. The semiconductor component manufacturing apparatus according to claim 28, further comprising:

a display device for displaying judgment results by said joining determination apparatus; and a third memory for storing a change in impedance when said joining determination apparatus determines that the electronic component and circuit board are joined defectively;

wherein said joining determination apparatus makes said display device display the change in impedance when deciding that the electronic component and circuit board are joined defectively, and also makes said third memory store the change in impedance.

38. The semiconductor component manufacturing apparatus according to claim 29, further comprising:

a display device for displaying judgment results by said joining determination apparatus; and a third memory for storing a change in impedance when said joining determination apparatus determines that the electronic component and circuit board are joined defectively;

wherein said joining determination apparatus makes said display device display the change in impedance when deciding that the electronic component and circuit board are joined defectively, and also makes said third memory store the change in impedance.

39. The semiconductor component manufacturing apparatus according to claim 30, further comprising:

a display device for displaying judgment results by said joining determination apparatus; and a third memory for storing a change in impedance when said joining determination apparatus determines that the electronic component and circuit board are joined defectively;

wherein said joining determination apparatus makes said display device display the change in impedance when deciding that the electronic component and circuit board are joined defectively, and also makes said third memory store the change in impedance.

40. The semiconductor component manufacture method according to claim 5, wherein the ultrasonic vibration is changed to improve the joining of the electronic component and circuit board when it is decided that the joining is defective during the joining.

* * * * *